(12) United States Patent
Kawase et al.

(10) Patent No.: US 7,361,594 B2
(45) Date of Patent: Apr. 22, 2008

(54) METHOD OF MANUFACTURING A THIN FILM TRANSISTOR, THIN FILM TRANSISTOR, THIN FILM TRANSISTOR CIRCUIT, ELECTRONIC DEVICE, AND ELECTRONIC APPARATUS

(75) Inventors: Takeo Kawase, Suwa (JP); Mitsuaki Harada, Chino (JP); Satoshi Kimura, Fujimi-cho (JP); Hidemichi Furihata, Chino (JP)

(73) Assignee: Seiko Epson Corporation, Tokyo (JP)

( * ) Notice: Subject to any disclaimer, the term of this patent is extended or adjusted under 35 U.S.C. 154(b) by 325 days.

(21) Appl. No.: 10/988,634

(22) Filed: Nov. 16, 2004

(65) Prior Publication Data

US 2005/0151195 A1 Jul. 14, 2005

(30) Foreign Application Priority Data

Nov. 19, 2003 (JP) ............................. 2003-390001

(51) Int. Cl.
*H01L 21/44* (2006.01)
(52) U.S. Cl. ....................................... 438/678; 438/151
(58) Field of Classification Search ................ 438/778, 438/792, 678, 151, 233, 197, 161, FOR. 390, 438/FOR. 184
See application file for complete search history.

(56) References Cited

U.S. PATENT DOCUMENTS

| | | | |
|---|---|---|---|
| 5,946,551 A | 8/1999 | Dimitrakopoulos et al. | |
| 6,329,226 B1 | 12/2001 | Jones et al. | |
| 6,344,662 B1 | 2/2002 | Dimitrakopoulos et al. | |
| 6,555,411 B1 * | 4/2003 | Bao et al. | 438/99 |
| 6,842,657 B1 * | 1/2005 | Drzaic et al. | 700/120 |

(Continued)

FOREIGN PATENT DOCUMENTS

EP 1 022 770 A2 7/2000

(Continued)

OTHER PUBLICATIONS

NiDheasuna C., et al., "The application of selective electroless plating for microelectronics applications," ESSDERC 90, Nottingham, September, Session 2B7.

(Continued)

*Primary Examiner*—S. V. Clark
(74) *Attorney, Agent, or Firm*—Oliff & Berridge PLC

(57) ABSTRACT

Aspects of the invention can provide a method of manufacturing a thin film transistor capable of manufacturing a high-performance thin film transistor with a simple process, a thin film transistor manufactured using the method of manufacturing a thin film transistor, and a thin film transistor circuit, an electronic device, and an electronic apparatus each equipped with the thin film transistor. The method of manufacturing a thin film transistor according to the invention can include the first step of forming a source electrode and a drain electrode on a substrate by an electroless plating process, the second step of forming an organic semiconductor layer in at least an area between the source electrode and the drain electrode using a costing method, the third step of forming a gate insulating layer on the organic semiconductor layer using a coating method, and the fourth step of forming a gate electrode using a coating method so as to overlap an area on the gate insulating layer and between the source electrode and the drain electrode.

18 Claims, 10 Drawing Sheets

U.S. PATENT DOCUMENTS

| | | |
|---|---|---|
| 2002/0128515 A1 | 9/2002 | Ishida et al. |
| 2002/0182890 A1 | 12/2002 | Ishida et al. |
| 2005/0059193 A1* | 3/2005 | Yoneya .................. 438/151 |
| 2005/0194640 A1* | 9/2005 | Lazarev .................. 257/347 |
| 2006/0086933 A1* | 4/2006 | Iechi et al. ................. 257/40 |

FOREIGN PATENT DOCUMENTS

| | | |
|---|---|---|
| GB | 2 388 709 | 11/2003 |
| GB | 2 391 385 | 2/2004 |
| JP | A 05-055568 | 3/1993 |
| KR | A-1998-080190 | 11/1998 |
| WO | WO 01/08242 A1 | 2/2001 |
| WO | WO 01/47043 A1 | 6/2001 |
| WO | WO 01/47045 A1 | 6/2001 |
| WO | WO 02/073712 A1 | 9/2002 |

OTHER PUBLICATIONS

Teng, K.F., et al., "Metallization of Solar Cells with Ink Jet Printing and Silver Metallo-Organic Inks," IEEE Transactions on Components, Hyprids, and Manufacturing Technology, vol. 11, No. 3, Sep. 1988.

Bürgi L, et al., "Close look at charge carrier injection in polymer field-effect transistors," Journal of Applied Physics, vol. 94, No. 9, Nov. 1, 2003.

* cited by examiner

METHOD OF MANUFACTURING A THIN FILM TRANSISTOR, THIN FILM TRANSISTOR, THIN FILM TRANSISTOR CIRCUIT, ELECTRONIC DEVICE, AND ELECTRONIC APPARATUS

BACKGROUND OF THE INVENTION

1. Field of Invention

Aspects of the invention can relate to a method of manufacturing a thin film transistor, a thin film transistor, a thin film transistor circuit, an electronic device, and an electronic apparatus.

2. Description of Related Art

Related art, thin film transistors using organic materials (organic semiconductor materials) presenting electrically conductive properties similar to semiconductors are being developed. The thin film transistors have advantages of being low-profile and can realize weight-saving, flexibility, low material cost and the like. Further, they can be used as switching elements for flexible displays or the like.

As such related art thin film transistors, a structure is proposed, for example, in Japanese Unexamined Patent Publication No. 5-55568, International Patent Publication No. WO0147045, and International Patent Publication No. WO0147043, in which a source electrode and a drain electrode are formed on a substrate with an organic semiconductor layer, a gate insulating layer, and a gate electrode stacked on these electrodes in this order.

Japanese Unexamined Patent Publication No. 5-55568 discloses that a vacuum deposition method is used for forming a gate electrode, a source electrode, and a drain electrode. By forming an insulating layer and an organic semiconductor layer using the vacuum deposition method in addition to forming the gate electrode, the source electrode, and the drain electrode using the vacuum deposition method as described therein, a high-performance thin film transistor can be manufactured with good reproducibility. However, the vacuum deposition method requires a large-scale facility, and presents problems of high-cost and so on derived from large power consumption required to form the films.

Meanwhile, International Patent Publication No. WO0147045 and International Patent Publication No. WO0147043 disclose that all of the gate electrode, the source electrode, drain electrode, the insulating layer, and the organic semiconductor layer are formed as films by a wet process under the atmospheric pressure.

According to this, a thin film transistor can be manufactured with a low cost. However, in the actual situation, the thin film transistors described in the International Patent Publication No. WO0147045 and International Patent Publication No. W00147043 have sufficient properties in comparison with thin film transistors manufactured by the vacuum deposition process.

SUMMARY OF THE INVENTION

Aspects of the invention can provide a method of manufacturing a thin film transistor capable of manufacturing a high-performance thin film transistor with a simple process, a thin film transistor manufactured using the method of manufacturing a thin film transistor, and a thin film transistor circuit, an electronic device, and an electronic apparatus each equipped with the thin film transistor.

An exemplary method of manufacturing a thin film transistor according to the present invention, can include the steps of forming a source electrode and a drain electrode on a substrate by an electroless plating process, forming an organic semiconductor layer in at least an area between the source electrode and the drain electrode using a coating method, forming a gate insulating layer on the organic semiconductor layer using a coating method, and forming a gate electrode using a coating method so as to overlap an area on the gate insulating layer and between the source electrode and the drain electrode. Thus, a thin film transistor with superior characteristics can be manufactured by a simple process.

In the exemplary method of manufacturing a thin film transistor according to the present invention, it is preferable that, in the step, forming the source and gate electrodes, the source electrode and the drain electrode are selectively formed by providing an electroless plating solution inside an opening of a mask provided on the substrate.

Thus, the further simplification of the manufacturing steps of a thin film transistor, reduction of the plating solution consumption, and so on can be achieved.

In the exemplary method of manufacturing a thin film transistor according to the present invention, it is preferable that, in the step, forming the source and gate electrodes, a plating solution used for the electroless plating process includes a reducing agent and a metallic salt of a metal for forming the source electrode and the drain electrode, and is substantially free of alkali metallic ions. Thus, the characteristics of the organic semiconductor layer can be prevented from deteriorating.

In the exemplary method of forming a thin film transistor according to the present invention, the content of the metallic salt in the plating solution is preferably in a range of 1 through 50 g/L. Thus, the plated film can be formed at an appropriate deposition rate.

In the method of forming a thin film transistor according to the present invention, the reducing agent is preferably composed mainly of at least one of hydrazine and ammonium hypophosphite. Thus, the deposition rate of the plated film can be appropriate, which makes it easy to control the thickness of the plated film.

In the exemplary method of forming a thin film transistor according to the present invention, the content of the reducing agent in the plating solution is preferably in a range of 10 through 200 g/L. Thus, the plated film can be formed at a further appropriate deposition rate.

In the method of manufacturing a thin film transistor according to the present invention, the plating solution preferably includes a pH adjuster. Thus, it can be prevented or controlled that the pH of the plating solution is lowered as electroless plating proceeds, and as a result, slow-down of the deposition rate or changes in composition or characteristics of the plated film can effectively be prevented.

In the exemplary method of manufacturing a thin film transistor according to the present invention, the pH adjuster can be preferably composed mainly of at least one of ammonia water, trimethyl ammonium hydride, and ammonium sulfide. Thus, slow-down of the deposition rate or changes in composition or characteristics of the plated film can more surely be prevented.

In the exemplary method of manufacturing a thin film transistor according to the present invention, the pH of the plating solution used in the electroless plating process is preferably in a range of 5 through 12. Thus, the deposition rate becomes especially proper, and accordingly the plated film having an even thickness can be formed with high precision.

In the method of manufacturing a thin film transistor according to the invention, the temperature of the plating solution used in the electroless plating process is preferably in a range of 30 through 90° C. Thus, the deposition rate becomes especially proper, and accordingly the plated film having an even thickness can be formed with high precision.

In the method of manufacturing a thin film transistor according to the present invention, it is preferable that, in the step forming the source and drain electrodes, both of the source electrode and the drain electrode are formed like comb-teeth and arranged to engage with each other. Thus, the area of the section where the gate electrode overlaps the source electrode or the drain electrode can be prevented from increasing, and accordingly, the characteristics of the thin film transistor can further be enhanced.

In the method of manufacturing a thin film transistor according to the present invention, each of the source electrode and the drain electrode is preferably composed mainly of one of Ni, Cu, Pd, Au, Pt, and an alloy including one of Ni, Cu, Pd, Au, and Pt. Thus, the characteristics of the thin film transistor can further be enhanced.

The method of manufacturing a thin film transistor according to the present invention, preferably can include prior to the step forming an organic semiconductor layer, the step of removing an organic matter existing in the side of the substrate surface where the organic semiconductor layer is to be formed. Thus, the adhesiveness of the source electrode and the drain electrode with the organic semiconductor layer can be enhanced.

In the method of manufacturing a thin film transistor according to the invention, the organic matter can be preferably removed by a plasma process.

According to the plasma process, the organic matters can surely be removed in a short period of time.

In the method of manufacturing a thin film transistor according to the present invention, the plasma process is preferably executed under the atmospheric pressure. Thus, a low manufacturing cost and a short turn around time in manufacturing can be achieved.

In the method of manufacturing a thin film transistor according to the invention, in the plasma process, plasma is preferably generated using a gas composed mainly of at least one of oxygen, nitrogen, argon, helium, and fluorocarbon. Thus, the equipment can be simplified because these gases can generate plasma in low vacuum atmosphere or under the atmospheric pressure.

In the method of manufacturing a thin film transistor according to the invention, the organic semiconductor layer is preferably composed mainly of a conjugated polymeric material. The conjugated polymeric materials have particularly high carrier migratory aptitude because of characteristic distributions of the electron clouds.

In the method of manufacturing a thin film transistor according to the present invention, the conjugated polymeric material is preferably composed mainly of at least one of fluorene-bithiophene copolymer, polyarylamine, and derivatives thereof. These materials are preferable because they are difficult to be oxidized, and accordingly stable in air.

In the method of manufacturing a thin film transistor according to the present invention, in the step forming a gate electrode, an inkjet method is preferably used as a coating method for forming the gate electrode. According to the inkjet method, the gate electrode having a predetermined shape can easily and surely be formed.

In the method of manufacturing a thin film transistor according to the present invention, the gate electrode is preferably composed mainly of an electrically conductive polymeric material.

In the method of manufacturing a thin film transistor according to the present invention, the gate electrode is preferably formed using a fluid including a metal particle.

In the method of manufacturing a thin film transistor according to the present invention, the metal particle is preferably composed mainly of Ag. By using a particle composed mainly of Ag, the material for forming the gate electrode can easily be prepared, and further, high conductivity can be obtained in the resulting gate electrode.

In the method of manufacturing a thin film transistor according to the present invention, the substrate can be a resin substrate composed mainly of a resin material, the method of manufacturing a thin film transistor preferably comprises, prior to the step forming a source and drain electrode, the step of executing an adhesiveness enhancing process for enhancing adhesiveness with the source electrode and the drain electrode on a surface of the resin substrate where the source electrode and the drain electrode are to be formed. Thus, the characteristics of the thin film transistor can further be enhanced.

In the exemplary method of manufacturing a thin film transistor according to the invention, the adhesiveness enhancing process preferably comprises the step of etching, with an etching fluid including a transition metal oxide and an inorganic acid, the surface of the resin substrate where the source electrode and the drain electrode are to be formed, and the step of treating the surface of the resin substrate where the source electrode and the drain electrode are to be formed using a treatment fluid including a reducing agent substantially free of an alkali metal element. Thus, the adhesiveness enhancing process can be executed while preventing the characteristics of the organic semiconductor layer from deteriorating.

In the method of manufacturing a thin film transistor according to the present invention, the reducing agent is preferably composed mainly of an ammonium compound. The ammonium compound is preferable because of its superior reduction performance.

In the method of manufacturing a thin film transistor according to the present invention, the ammonium compound is preferably ammonium sulfite hydrate. The ammonium sulfite hydrate is preferable because of their particularly superior reduction performance.

A thin film transistor according to the present invention is manufactured by the method of manufacturing a thin film transistor according to the invention. Thus, the thin film transistor with superior characteristics (switching characteristics) can be obtained.

A thin film transistor circuit according to the present invention comprises the thin film transistor according to the present invention. Thus, the thin film transistor circuit with high reliability can be obtained.

An electronic device according to the present invention comprises the thin film transistor circuit according to the present invention. Thus, the electronic device with high reliability can be obtained.

An electronic apparatus according to the present invention comprises the electronic device according to the present invention. Thus, the electronic apparatus with high reliability can be obtained.

BRIEF DESCRIPTION OF THE DRAWINGS

The invention will be described with reference to the accompanying drawings, wherein like numerals reference like elements, and wherein:

FIGS. 1A and 1B are views showing the thin film transistor of the first configuration, in which FIG. 1A is a vertical cross-sectional view, and FIG. 1B is a plan view;

FIGS. 6A and 6B are views showing the thin film transistor of the second configuration, in which FIG. 6A is a vertical cross-sectional view, and FIG. 6B is a plan view;

DETAILED DESCRIPTION OF PREFERRED EMBODIMENTS

Detailed descriptions are presented herein based on exemplary embodiments of a method of manufacturing a thin film transistor, a thin film transistor, a thin film transistor circuit, an electronic device, and an electronic apparatus according to the invention.

Firstly, a thin film transistor and a manufacturing method thereof according to the present invention are described.

At first, a first exemplary configuration (a first embodiment) of a thin film transistor according to the invention is explained.

Figure 1A:
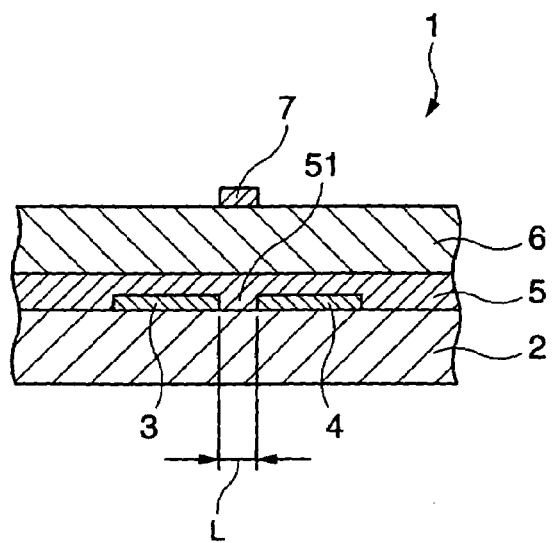
Figure 1B:
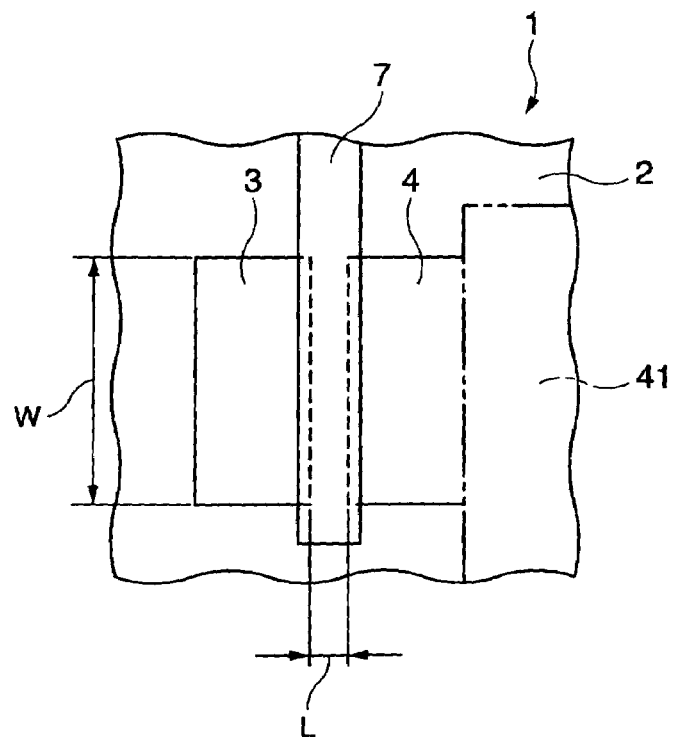

FIGS. 1A and 1B are views showing the thin film transistor of the first configuration, in which FIG. 1A is a vertical cross-sectional view, and FIG. 1B is a plan view. Note that the upper side of FIG. 1A is referred to as upper side and the lower side thereof is referred to as lower side in the following descriptions.

A thin film transistor 1 shown in FIGS. 1A and 1B is provided on a substrate 2, and is composed of a source electrode 3, a drain electrode 4, an organic semiconductor layer (an organic layer) 5, a gate insulating layer 6, and a gate electrode 7 stacked on the substrate 2 in this order. Specifically, the thin film transistor 1 is provided on the substrate 2 so that the source electrode 3 and the drain electrode 4 are separated, and the organic semiconductor layer 5 is provided so as to cover the electrodes 3 and 4. Further, the gate insulating layer 6 is provided on the organic semiconductor layer 5, on which the gate electrode 7 is provided so as to overlap at least an area between the source electrode 3 and the drain electrode 4.

In the thin film transistor 1, a part of the organic semiconductor layer 5 positioned between the source electrode 3 and the drain electrode 4 is defined as a channel region 51 through which carriers are transferred. Hereinafter, in the channel region 51, the length in the carrier transfer direction, namely the distance between the source electrode 3 and the drain electrode 4 is referred to as a channel length L, and the length in the direction perpendicular to the channel length L direction is referred to as a channel width W.

The thin film transistor 1 described above is a transistor with a configuration in which the source electrode 3 and the drain electrode 4 are provided via the gate insulating layer 6 nearer to the substrate 2 than the gate electrode 7, namely a thin film transistor with the top-gate structure.

Hereinafter, each part of the thin film transistor will be sequentially described.

The substrate 2 is a member for supporting each of the layers (each of the sections) composing the thin film transistor 1. For example, a plastic substrate (a resin substrate) made of polyimide, polyethylene terephthalate (PET), polyethylene naphthalate (PEN), polyethersulfone (PES), aromatic polyester (liquid crystal polymer), or the like, a grass substrate, a quartz substrate, a silicon substrate, a gallium arsenide substrate and so on can be used as the substrate 2. If the thin film transistor needs to be flexible, the resin substrate is selected as the substrate 2.

A foundation layer can be provided on the substrate 2. The foundation layer is provided for, for example, preventing ions from diffusing from the surface of the substrate 2, or for enhancing adhesiveness (joining property) of the source electrode 3 and the drain electrode with the substrate 2.

A material for the foundation layer is not limited, but in case a glass substrate is used as the substrate 2, silicon dioxide ($SiO_2$), silicon nitride (SiN), or the like can preferably be used as the material for the foundation layer.

The source electrode 3 and drain electrode 4 are provided on the substrate 2 in the channel length L direction side by side with a predetermined distance. As a material for forming the source electrode 3 and the drain electrode 4, a material that can be deposited by an electroless plating process described below. Specifically, for each of materials composing the source electrode 3 and the drain electrode 4, Ni, Cu, Co, Au, Pd, or materials composed mainly of alloys including these metals are preferably used. By forming the source electrode 3 and the drain electrode 4 with these metal materials, the performance of the thin film transistors 1 can further be enhanced.

The thicknesses (in average) of the source electrode 3 and the drain electrode 4 are not limited, but are preferably in a range of about 30 through 300 nm, and are further preferably in a range of about 50 through 150 nm. According to the electrode forming method of the present invention, such a thin electrode can precisely be formed.

The distance (edge-to-edge distance) between the source electrode 3 and the drain electrode 4, namely the channel length L is preferably in a range of about 2 through 30 μm, and further preferably in a rage of about 5 through 20 μm. If the channel length L is smaller than the lower limit described above, there may be a margin of error in the channel lengths of the obtained thin film transistors 1, which may cause fluctuations in the characteristics (transistor characteristics). In contrast, if the channel length L is greater than the upper limit described above, the absolute value of the threshold voltage becomes large while the amount of the drain current becomes small, which may cause an insufficient performance of the thin film transistor.

The channel width W is preferably in a range of about 0.1 through 5 mm, and more preferably in a range of about 0.5 through 3 mm. If the channel width W is narrower than the lower limit mentioned above, the value of the drain current becomes smaller, which may cause an insufficient performance of the thin film transistor. In contrast, if the channel width is wider than the upper limit value, the size of the thin film transistor becomes larger, and an increased parasitic capacitance or increased leak current to the gate electrode 7 via the gate insulating layer 6 may be resulted in.

Further, on the substrate 2, there is provided the organic semiconductor layer 5 so as to cover the source electrode 3 and the drain electrode 4. The organic semiconductor layer 5 is made mainly of an organic semiconductor material (an organic material presenting with an electrically conductive property similar to a semiconductor material). The organic semiconductor layer 5 is preferably arranged substantially parallel to the channel length L direction at least in a channel region 51. According to this structure, the carrier mobility in the channel region 51 is increased resulting in the faster operational speed of the thin film transistor 1.

As the organic semiconductor material, for example, small molecule organic semiconductor materials such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, phthalocyanine, or derivatives of the above, or polymeric semiconductor materials such as poly-N-vinylcarbazole, polyvinylpyrene, polyvinylanthracene, polythiophene, polyhexylthiophene, poly(p-phenylenevinylene), polythenylenevinylene, polyarylamine, pyrene-formaldehyde resin, ehtylcarbazole-formaldehyde resin, fluorene-bithiophene copolymer, fluorene-arylamine copolymer, or derivatives of the above can be cited, and these materials can be used alone or in combination, and in particular, materials made mainly of polymeric organic semiconductor materials (conjugated polymeric materials) are preferably be used. The conjugated polymeric materials have particularly high carrier migratory aptitude because of characteristic distributions of the electron clouds.

The polymeric organic semiconductor materials can be formed as films by simple processes, and easily arranged in predetermined directions. Further, in these materials, materials made mainly of at least one of fluorene-bithiophen copolymer, polyarylamine, or derivatives of the two are preferably used as polymeric organic semiconductor materials (conjugated polymeric materials) for the reasons of the oxidation resistance and the stability in the air.

Further, the organic semiconductor layer 5 composed mainly of a polymeric organic semiconductor material, which can be used for forming thinner and/or light-weight products as well as excels in flexibility, can be suitable for an application to thin film transistors used as switching elements for flexible displays.

The thickness (in average) of the organic semiconductor layer 5 is preferably in a range about 0.1 through 1000 nm, and more preferably in a range of about 1 through 500 nm, and further preferably in a range of about 10 through 100 nm.

Note that the organic semiconductor layer 5 is not limited to those configured so as to cover the source electrode 3 and the drain electrode 4, but can be formed on at least an area (the channel region 51) defined between the source electrode 3 and the drain electrode 4.

The gate insulating layer 6 is provided on the organic semiconductor layer 5. The gate insulating layer 6 is provided for insulating the gate electrode 7 from the source electrode 3 and the drain electrode 4. The gate insulating layer 6 is preferably composed mainly of an organic material (in particular an organic polymeric material). The gate insulating material 6 composed mainly of an organic polymeric material is easy to be formed, and capable of enhancing adhesiveness with the organic semiconductor layer 5.

As such an organic polymeric material, for example, acrylic resin, such as polystyrene, polyimide, polyamideimide, polyvinylphenylene, polycarbonate (PC), or polymethylmethacrylate (PMMA), fluorinated resin, such as polytetrafluoroethylene (PTFE), phenolic resin, such as polyvinylphenol or novolak resin, olefinic resin, such as polyethylene, polypropylene, polyisobutylene, or polybutene can be cited, and one or more of these materials can be used alone or in combination.

The thickness (in average) of the gate electrode 6 is not particularly limited, but is preferably in a range of about 10 through 5000 nm, and is further preferably in a range of about 100 through 1000 nm. By arranging the thickness of the gate electrode 6 within the range described above, the thin film transistor 1 can be prevented from becoming larger (in particular, increasing the thickness thereof) while surly insulating the source electrode 3 and the drain electrode 4 from the gate electrode 7.

Note that the gate insulating layer 6 is not limited to a single layer structure, but can be of a stacked layer structure including a plurality of layers.

Further, as the composing material of the gate insulating layer 6, for example, inorganic insulating materials such as $SiO_2$ can be used. By coating a solution such as polysilicate, polyciloxane, or polysilazane and then heating the coating film under existence of oxygen or water vapor, $SiO_2$ can be obtained from the liquid material. Further, by coating a metal alkoxide solution, and then heating it under the oxygen environment, an inorganic insulating material can be obtained (known as the sol-gel process).

The gate electrode 7 is provided on the gate insulating layer 6. As a composing material of the gate electrode 7, for example, metallic materials such as Pd, Pt, Au, W, Ta, Mo, Al, Cr, Ti, Cu, or alloys including the above, electrically conductive oxides such as ITO, FTO, ATO, $SnO_2$, or the like, carbon materials such as carbon black, carbon nano tube, fullerene, or the like, electrically conductive polymeric materials such as polyacetylene, polypyrrole, polythiophene such as PEDOT (poly-ethylenedioxythiophene), polyaniline, poly(p-phenylene), poly(p-phenylenevinylene), polyfluorene, polycarbazole, polysilane, or derivatives of the above can be cited, and usually used in a condition provided with conductivity by being doped with iron chloride, iodine, strong acid, organic acid, or polymer such as polystyrene sulfonic acid. Further, the above materials can be used alone or in combination.

The thickness (in average) of the gate electrode 7 is not particularly limited, but is preferably in a range about 0.1 through 5000 nm, and more preferably in a range of about 1 through 5000 nm, and further preferably in a range of about 10 through 5000 nm.

In the above thin film transistors 1, the amount of current flowing between the source electrode 3 and the drain electrode 4 can be controlled by altering the voltage applied to the gate electrode 7.

Namely, in an OFF state in which no voltage is applied to the gate electrode 7, even if some voltage is applied between the source electrode 3 and the drain electrode 4, only vary little current flows because very little carriers exist in the organic semiconductor layer 5. In contrast, in an ON state in which substantial voltage is applied to the gate electrode 7, electrical charge is induced in a portion of the organic semiconductor layer 5 facing the gate electrode 6 to form a flow channel for the carrier in the channel region 51. In this condition, if substantial voltage is applied between the source electrode 3 and the drain electrode 4, current flows through the channel region 51.

The thin film transistor 1 described above can be manufactured as follows, for example.

A method of manufacturing the thin film transistor 1 is hereinafter described focusing on a first and a second manufacturing methods respectively.

Firstly, a first manufacturing method (a first embodiment of a method of manufacturing a thin film transistor according to the invention) of the thin film transistor 1 shown in FIGS. 1A and 1B is described.

Each of FIGS. 2A through 4J are views (a vertical cross-sectional view) for explaining the first manufacturing method of the thin film transistor shown in FIGS. 1A and 1B. Note that the upper side of FIGS. 2A through 4J is referred to as upper side and the lower side thereof is referred to as lower side in the following descriptions.

The first manufacturing method of the thin film transistor 1 can include [A1] the step of forming the source electrode and the drain electrode, [A2] the step of removing an organic matter, [A3] the step of forming the organic semiconductor layer, [A4] the step of forming the gate insulating layer, and [A5] the step of forming the gate electrode. Hereinafter, each of these steps is sequentially described.

[A1] the step of forming the source electrode and the drain electrode (the first step)

Figure 2A:
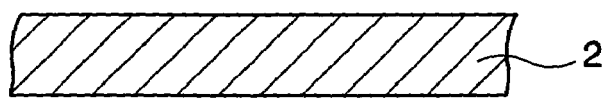
FIGS. 2A through 2C are views (vertical cross-sectional views) for explaining the second manufacturing method of the thin film transistor shown in FIGS. 1A and 1B.

[A1-I] Firstly, the substrate 2 as shown in FIG. 2A is provided and then washed by, for example, water (purified water) and/or organic solvent alone or in combination. According to the above, the wettability of the substrate 2 to water is improved to easily contact with various processing fluids shown below.

Note that, if a resin substrate made of, for example, polyimide is used as the substrate 2, a process for enhancing the adhesiveness of a surface of the substrate 2 with the source electrode 3 and the drain electrode 4 is preferably executed on that surface prior to the present step [A1-I] (the step [A1]).

The process (surface roughening) for enhancing the adhesiveness is executed by etching the surface of the substrate 2 with the etching fluid and then treating with processing fluid including a reducing agent.

As the etching fluid, for example, a fluid including a transition metal oxide such as $CrO_3$, $MnO_2$, or the like, and an inorganic acid such as sulfuric acid, hydrochloric acid, or the like can be used.

Meanwhile, the reducing agent used for the processing fluid is not particularly limited, but is preferably selected from those substantially free of alkali metals. According to the above, since no alkali metal ions is captured to the surface of the substrate 2, the alkali metal ions are prevented from diffusing to (interfusing in) the organic semiconductor layer 5 formed in a process executed later, and as a result, deterioration of the performance of the organic semiconductor layer 5 can be prevented.

As such a reducing agent, ammonium compounds such as ammonium sulfite hydrate or ammonium hypophosphite, or hydrazine or the like can be cited, in which those composed mainly of ammonium compounds are preferable, and those composed mainly of ammonium sulfite hydrate are further preferable. The ammonium compounds (especially the ammonium sulfite hydrate) are preferable because of their superior reduction performance.

[A1-II] Subsequently, pre-processing for forming a plated film 8 is executed on the substrate 2.

This pre-processing is executed by, for example, bringing a solution (surface-active solution) including a cationic surface-active agent or an anionic surface-active agent into contact with the substrate 2. By thus treated, the cationic surface-active agent or the anionic surface-active agent is attached on the surface of the substrate 2.

The surface of the substrate 2 is positively charged when the cationic surface-active agent is attached, or is negatively charged when the anionic surface-active agent is attached. If the charge polarity of a catalytic agent used in the electroless plating is opposite to the charge of the substrate, the catalytic agent is easy to be attached thereto, and consequently, the adhesiveness of the substrate 2 with the plated film 8 (the source electrode 3 and the drain electrode 4) to be formed is enhanced.

As the method of bringing the surface-active solution into contact with the substrate 2, for example, a method of dipping the substrate 2 into the surface-active solution (a dipping method) and a method of spraying the surface-active solution onto the substrate 2 can be cited. The dipping method is particularly preferable because a large amount of substrate 2 can easily be processed by the dipping method.

Although various methods can be used as the method of bringing the fluid into contact with the substrate 2 as described above, the case of using the dipping method as the fluid contact method is described as an example in the following steps.

As the cationic surface-active agent, for example, alkyl ammonium chloride, benzalkonium chloride, benzethonium chloride, stearic acid, and so on can be cited, and one or more of these agents can be used alone or in combination.

The temperature of the surface-active solution in use is preferably in a range of about 0 through 70° C., and further preferably in a range of about 10 through 40° C.

Further, the process time of the substrate 2 in the surface-active solution is preferably in a range of about 10 through 90 seconds, and further preferably in a range of about 30 through 60 seconds.

The substrate 2 thus pre-processed is washed using, for example, purified water (ultra pure water), ion exchanged water, distilled water, or RO water.

[A1-III] Subsequently, the catalytic agent is attached on the surface of the substrate 2. As the catalytic agent, Au, Ag, Pd, Pt, and so on can be cited, and one or more of these agents can be used alone or in combination.

In case Pd out of these agents is used as the catalytic agent, the substrate 2 is dipped in colloidal suspension of a Pd alloy such as Sn-Pd or solution of an ionic Pd catalytic agent such as palladium chloride to attach the Pd alloy or the ionic Pd catalytic agent on the surface of the substrate 2. After then, Pd is exposed on the substrate 2 by removing elements which are not involved in the catalytic action.

In case the Sn-Pd colloidal suspension is used, for example, the substrate 2 is dipped in acidic solution after being dipped in the colloidal suspension. Thus, Sn coordinated with Pd is dissolved to be removed resulting in a condition in which Pd is exposed on the surface of the substrate 2.

As the acidic solution, for example, a solution including an acid such as $HBF_4$ and a reducing agent such as glucose, or a solution made by adding sulfuric acid to the aforementioned solution can be used.

The temperature of the solution including the catalytic agent in use is preferably in a range of about 0 through 70° C., and further preferably in a range of about 10 through 40° C.

The process time of the substrate 2 in the solution including the catalytic agent is preferably in a range of about 10 seconds through 5 minutes, and further preferably in a range of about 20 seconds through 3 minutes.

Meanwhile, the temperature of the acidic solution in use is preferably in a range of about 0 through 70° C., and further preferably in a range of about 10 through 40° C.

The process time of the substrate 2 in the acidic solution is preferably in a range of about 10 seconds through 5 minutes, and further preferably in a range of about 30 seconds through 3 minutes.

The substrate 2, to which the catalytic agent is thus attached (absorbed), is washed using, for example, purified water (ultra pure water), ion exchanged water, distilled water, or RO water.

Figure 2B:
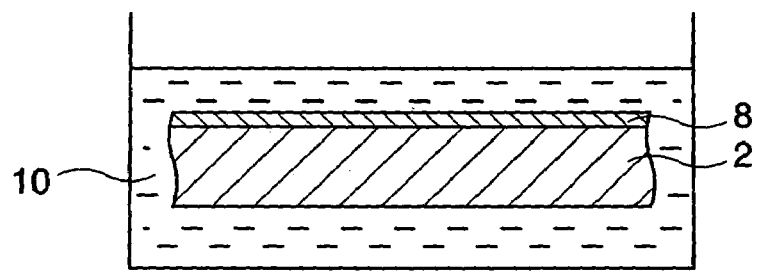

[A1-IV] Subsequently, as shown in FIG. 2B, the substrate 2 is dipped in the plating solution 10, and the metallic element (simple metallic element) is precipitated on the surface of the substrate 2 to form the plated film 8.

Incidentally, as the plating solution 10 used for electroless plating, those including a metallic salt of the metal for forming the plated film 8 (the source electrode 3 and the drain electrode 4) and the reducing agent, but not substantially including any alkali metal ions are preferably used.

Namely, when preparing the plating solution 10 by resolving at least the metallic salt and the reducing agent into the solvent, those not including alkali metal as their composing element are preferably used as the material in the preparation.

Thus, the alkali metal ions can be prevented from being mixed into the plated film 8 to be formed. As a result, the alkali metal ions can be prevented from being diffused (mixed) into the organic semiconductor layer 5 to be formed in the following process to prevent the performance of the organic semiconductor layer 5 from deteriorating.

As the metallic salt, for example, sulfate salt, nitrate salt, or the like is preferably used.

As the reducing agent, for example, hydrazine, ammonium hypophosphite, and so on can be cited. Among these agents, those composed mainly of at least one of hydrazine and ammonium hypophosphite are more preferable. By using these materials as the reducing agent under appropriate plating solution temperature and appropriate plating solution pH, the speed of forming the plated film 8 is made proper, which makes it easy to control the thickness of the film within the optimum range of the film thickness required to the source electrode 3 and the drain electrode 4.

Further, the resulting plated film 8 can also have an even thickness and preferable surface property (high film surface morphology).

The amount of the metallic salt included in the plating solution 10 (the amount of the metallic salt added to the solvent) is preferably in a range of about 1 through 50 g/L, and further preferably in a range of about 5 through 25 g/L. If the content of the metallic salt is too small, it may take a long time to form the plated film 8. In contrast, if the content of the metallic salt is increased beyond the upper limit described above, the effectiveness is not expected to be increased.

Further, the amount of the reducing agent included in the plating solution 10 (the amount of the reducing agent added to the solvent) is preferably in a range of about 10 through 200 g/L, and further preferably in a range of about 50 through 150 g/L.

If the amount of the reducing agent is too small, it may be difficult to efficiently reduce the metallic ions depending on the nature of the reducing agent. In contrast, if the content of the reducing agent is increased beyond the upper limit described above, the effectiveness is not expected to be increased.

It is preferable that a pH adjuster (a pH buffer) is further mixed (added) to such a plating solution 10. According to the above, it is prevented or controlled that the pH of the plating solution 10 is lowered as electroless plating proceeds, and as a result, slow-down of the deposition rate or changes in composition or characteristics of the plated film 8 can effectively be prevented.

As such a pH adjuster, various kinds can be cited. Those composed mainly of at least one of ammonia water, trimethyl ammonium hydride, and ammonium sulfide are preferable. Since these materials excel in buffering behavior, the aforementioned effect is remarkably exerted by using these materials as the pH adjustor.

By dipping the substrate 2 having the catalytic agent attached thereto into the plating solution 10 described above, the electroless plating reaction is promoted with the nucleate catalytic agent, thus forming the plated film 8. The pH of the plating solution 10 in use is preferably in a range of about 5 through 12, and further preferably in a range of about 6 through 10. The temperature of the plating solution 10 in use is preferably in a range of about 30 through 90° C., and further preferably in a range of about 40 through 80° C.

The process time of the substrate 2 in the plating solution 10 is preferably in a range of about 10 seconds through 5 minutes, and further preferably in a range of about 20 seconds through 3 minutes. If the pH and the temperature of the plating solution 10 and the process time by the plating solution 10 are arranged within the ranges mentioned above, the deposition rate becomes especially proper, and accordingly the plated film 8 having an even thickness can be formed with high precision.

Note that the thickness of the plated film 8 to be formed can be controlled by arranging the conditions of plating such as the operation temperature (the temperature of the plating solution), the operation time (the plating time), the amount of the plating solution, the pH of the plating solution, or the number of plating processes (the number of turns). Further, some additives such as a complexing agent, or a stabilizing agent can be added if necessary.

As the complexing agent, for example, carboxylic acid such as ethylenediamine tetra acetic acid or acetic acid, oxycarboxylic acid such as tartaric acid or citric acid, aminocarboxylic acid such as glycine, amine such as triethanolamine, and multiple alcohol such as glycerin or sorbitol can be cited. As the stabilizing agent, for example, 2,2'-bipyridyl, cyanide, ferrocyanide, phenanthroline, thiourea, mercapt benzothiazole, thioglycolic acid, and so on can be cited. The substrate 2 on which the plated film 8 is thus formed is washed using, for example, purified water (ultra pure water), ion exchanged water, distilled water, or RO water.

Figure 2C:
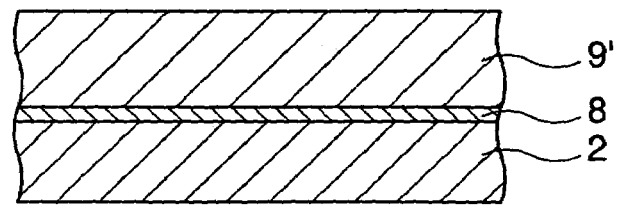

[A1-V] Subsequently, the resist layer 9 having a shape corresponding to the source electrode 3 and the drain electrode 4 is formed on the plated film 8. Firstly, as shown in FIG. 2C, resist material 9' is deposited (provided) on the plated film 8. Then, it is exposed via a photo mask corresponding to the shapes of the source electrode 3 and the drain electrode 4, and then developed by developing fluid.

Figure 3D:
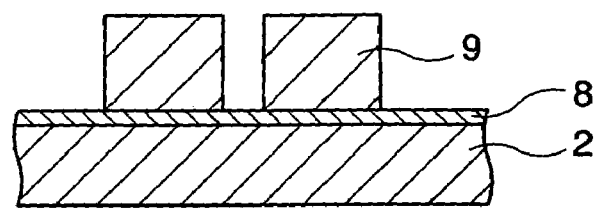
FIGS. 3D through 3F are views (vertical cross-sectional views) for explaining the second manufacturing method of the thin film transistor shown in FIGS. 1A and 1B.

According to the above, as shown in FIG. 3D, the resist layer 9 patterned to have the shape corresponding to the source electrode 3 and the drain electrode 4 can be obtained.

Figure 3E:
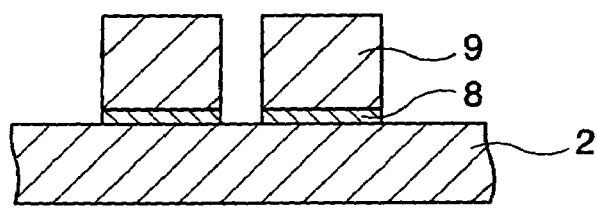

[A1-VI] Then, using the resist layer 9 as a mask, as shown in FIG. 3E, unnecessary portion of the plated film 8 is removed by etching. In this etching process, one or more of processes including physical etching methods such as plasma etching, reactive etching, beam etching, or photo-assist etching, and chemical etching methods such as wet etching can be executed alone or in combination. The wet etching is preferably used among these etching processes. Thus, the etching process can be executed with simple equipments and steps without any large-scale equipments such as a vacuum system. As an etching fluid used for the wet etching, for example, a solution including iron chloride, and a solution including sulfuric acid, nitric acid, or acetic acid can be cited.

Figure 3F:
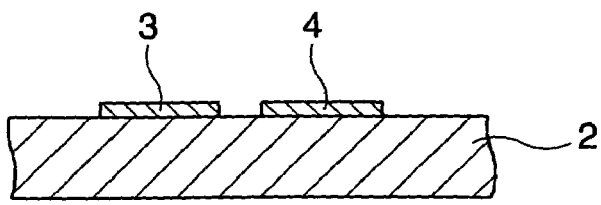

[A1-VII] And then, by removing the resist layer 9, the source electrode 3 and the drain electrode 4 as shown in FIG. 3F can be obtained. Although resist removing fluid is preferably used for removing the resist layer 9, other methods such as, for example, the physical etching methods mentioned above can also be used. As described above, by using the photolithography method and the etching method in combination, the source electrode 3 and the drain electrode 4 with high dimensional accuracy can easily and surely be formed.

Therefore, the distance (the channel length L) between the source electrode 3 and the drain electrode 4 can be set to be comparatively shorter, thus providing the thin film transistor 1 with low absolute value of the threshold voltage and large drain current, namely excelling at characteristics necessary for switching elements. Note that either of a negative type of resist material and a positive type of resist material can be used as the resist material of the photolithography method.

[A2] The step of Removing Organic Matters

Figure 4G:
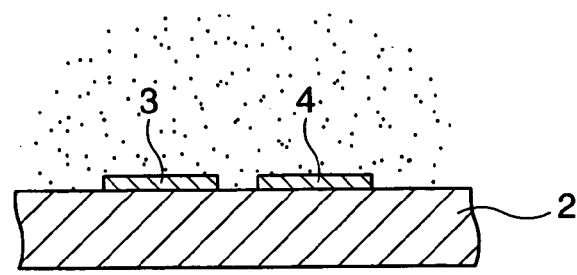
FIGS. 4G through 4J are views (vertical cross-sectional views) for explaining the second manufacturing method of the thin film transistor shown in FIGS. 1A and 1B.

Subsequently, the substrate 2 having the source electrode 3 and the drain electrode 4 formed thereon is washed using, for example, water (purified water or the like) and/or organic solvents alone or in combination. And then, as shown in FIG. 4G, any organic matters existing on the surface of the substrate 2, on which the organic semiconductor layer 5 is to be formed, are removed. Thus, the barrier for the carrier in the interface between the organic semiconductor layer 5 and the source electrode 3, the drain electrode 4 can be removed to improve the characteristics of the thin film transistor 1.

As the method (the removing method) of removing organic matters, for example, a plasma process, a process with ozone water, etching with an acid or an alkali, mechanical removal of the surface layer, and UV (in particular, deep UV) radiation can be cited, and one or more of these processes can be used alone or in combination. Among these processes, the plasma process is preferable as the method of removing the organic matters. According to the plasma process, the organic matters can surely be removed in a short period of time.

When executing the plasma process, the substrate 2 is carried in a chamber equipped with a decompression means and a plasma generation means, and can be processed by generating plasma in the chamber in a decompressed condition, or by ejecting plasma against the surface of the substrate from a head equipped with a plasma ejection nozzle. According to the latter method, since the plasma process can be executed in the atmospheric pressure, the chamber and the decompression means can be omitted to provide advantages of a low manufacturing cost and a short turn around time in manufacturing.

In the conditions of the atmospheric pressure plasma, for example, the gas flow rate is in a range of about 10 through 300 sccm, and the RF power is in a range of about 0.005 through 0.2 W/cm$^2$. The gas used for generating plasma is not particularly limited, but those composed mainly of at least one of oxygen, nitrogen, argon, helium, and fluorocarbon are preferably used therefor. Since plasma can be generated in low vacuum atmosphere or under the atmospheric pressure by mixing argon or helium with the main component, the equipment can be simplified.

Note that the present step [A2] can be omitted according to need.

[A3] The Step of Forming an Organic Semiconductor Layer (the Second Step)

Figure 4H:
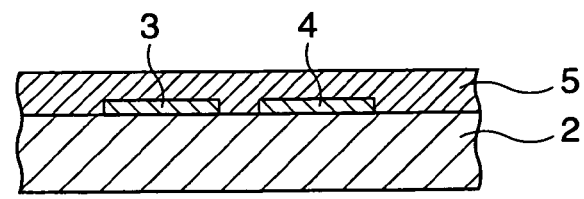
Figure 4I:
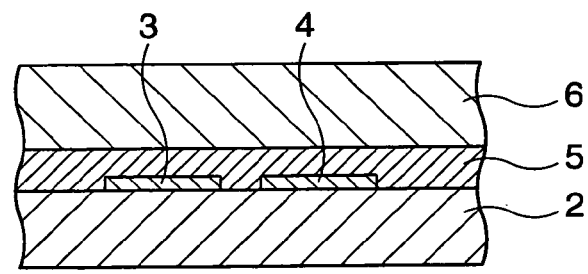

Then, as shown in FIG. 4H, the organic semiconductor layer 5 is formed on the substrate 2 having the source electrode 3 and the drain electrode 4 formed thereon using a coating method so as to cover the source electrode 3 and drain electrode 4.

In this case, the channel region 51 is formed between the source electrode 3 and the drain electrode 4 (an area corresponding to the gate electrode 7).

Specifically, the organic semiconductor layer 5 can be formed by coating (supplying) solution including an organic polymeric material or a precursor thereof on the substrate 2 using coating method so as to cover the source electrode 3 and the drain electrode 4, and then executing a post-process (e.g., heating, radiating with an infrared ray, or providing an ultrasonic ray) against the coating film according to need. It should be noted that, as a coating method, for example, a spin-coating method, a casting method, a micro gravure coating method, a gravure coating method, a bar coating method, a roller coating method, a wire bar coating method, a dip coating method, a spray coating method, a screen printing method, a flexographic printing method, an offset printing method, an inkjet printing method, a micro-contact printing method, and so on can be cited, and one or more of these methods can be used alone or in combination.

Note that the area in which the organic semiconductor layer 5 is formed is not limited to the structure shown in the drawings, and the organic semiconductor layer 5 can be formed only in the area (the channel region 51) defined between the source electrode 3 and the drain electrode 4. According to this structure, in case a plurality of thin film transistor 1 (element) is arranged on a single substrate, the organic semiconductor layer 5 for each element can separately be formed to reduce leak current and crosstalk between each of the elements. Further, the amount of the organic semiconductor material used therefore can be reduced, thus reducing the manufacturing cost. In case the organic semiconductor 5 is formed only in the channel region 51, the inkjet method, which can be executed in a non-contact manner, is particularly suitable. Further, the required resolution of 5 through 100 μm matches the resolution of the inkjet method.

In this case, as the solvent for dissolving the organic semiconductor material, for example, inorganic solvents such as nitric acid, sulfuric acid, ammonia, hydrogen peroxide, water, carbon disulfide, carbon tetrachloride, or ethylene carbonate, various organic solvents including ketones such as methyl ethyl ketone (MEK), acetone, diethyl ketone, methyl isopropyl ketone (MIPK), or cyclohexanon, alcohols solvents such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), cellosolve™ solvents such as methyl cellosolve, ethyl cellosolve, or phenyl cellosolve, aliphatic hydrocarbons solvents such as hexane, pentane, heptane, or cyclohexane, aromatic hydrocarbons solvents such as toluene, xylene, or benzene, heteroaromatic solvents such as pyridine, pyrazine, furan, pyrrole, thiophene, or methylpyrrolidone, amide solvents such as N,N-dimethylformamide (DMF) or N,N-dimethylacetamide (DMA), halogenated compounds solvents such as dichloromethane, chloroform, or 1,2-dichloroethane, esters solvents such as ethyl acetate, methyl acetate, or ethyl formate, sulfur compounds solvents such as dimethyl sulfoxide (DMSO) or sulfolane, nitrile solvents such as acetonitrile, propionitrile, or acrylonitrile, organic acids solvents, such as formic acid, acetic acid, trichloroacetic acid, or trifluoroacetic acid, or mixed solvents including the above can be used.

Since the organic semiconductor includes a conjugated system such as an aromatic hydrocarbon group or a heterocyclic group, it is generally easy to be dissolved with the aromatic hydrocarbons solvent. Toluene, xylene, trimethyl benzene, tetramethyl benzene, cyclohexyl benzene, and so on are particularly suitable solvents.

[A4] The Step of Forming a Gate Insulating Layer (the Third Step)

Subsequently, as shown in FIG. 41, the gate insulating layer 6 is formed on the organic semiconductor layer 5 using the coating method. Specifically, the gate insulating layer 6 can be formed by coating (supplying) solution including an insulating material or a precursor thereof on the organic semiconductor layer 5 using coating method, and then executing a post-process (e.g., heating, radiating with an infrared ray, or providing an ultrasonic ray) against the coating film according to need.

Further, the same method as above can be used as the coating method. In case the organic semiconductor layer 5 is composed of a soluble organic semiconductor material, a solvent with which the organic semiconductor layer 5 is not swollen nor dissolved should be selected as the solvent for the insulating material. As described above, since the organic semiconductor materials are easy to be dissolved with the aromatic hydrocarbons solvent, it is preferable to avoid such solvents when coating the insulating materials. Namely, water like solvents, alcohols solvents, ketones, ethers, esters solvents, aliphatic hydrocarbons solvents, or fluorinated solvents are preferably used.

[A5] The Step of Forming a Gate Electrode (the Fourth Step)

Figure 4J:
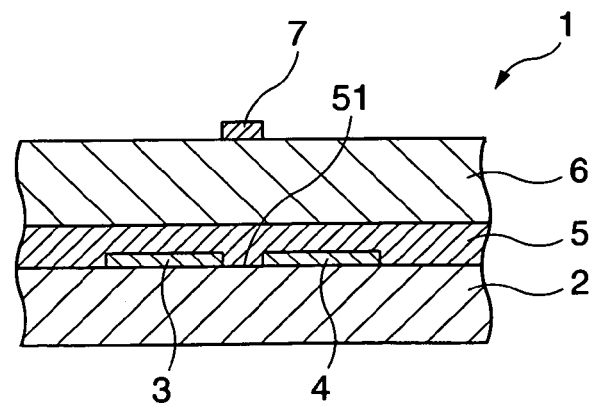

Subsequently, as shown in FIG. 4J, the gate electrode 7 is formed on the gate insulating layer 7 using the coating method. Specifically, the gate electrode 7 can be formed by coating (supplying) solution including an electrically conductive material (an electrode material) or a precursor thereof on the gate insulating layer 6 using coating method, and then executing a post-process (e.g., heating, radiating with an infrared ray, or providing an ultrasonic ray) against the coating film according to need. Further, although the same method as described above can be used as the coating method, using of the inkjet method is particularly preferable. According to the inkjet method, the gate electrode 7 having a predetermined shape can easily and surely be formed.

A method of forming the gate electrode 7 using the inkjet method is hereinafter described. In the inkjet method, patterning is executed by ejecting droplets of solution including an electrically conductive material and the precursor thereof (hereinafter referred to as ink) from a nozzle of a droplet ejection head. Note that, the viscosity (at room temperature) of the ink is not particularly limited, but is preferably in a range of about 3 through 10 cps, in general, and more preferably in a range of about 4 through 8 cps. If the viscosity of the ink is arranged in the range mentioned above, the droplets can more stably be ejected from the nozzle. Further, the volume (in average) of an ink droplet is not particularly limited, but is preferably in a range of about 0.1 through 40 pL in general, and further preferably in a range of about 1 through 30 pL. By arranging the volume (in average) of a single droplet in the range mentioned above, more precise shapes can be formed. Materials as described in <A> through <D> below, for example, can be used for the ink.

<A> In case the gate electrode 7 is composed with an organic polymeric material, a solution dissolving the organic polymeric material is used as the ink. In this case, as the solvent, for example, inorganic solvent such as nitric acid, sulfuric acid, ammonia, hydrogen peroxide, water, carbon disulfide, carbon tetrachloride, or ethylene carbonate, various organic solvent including ketones such as methyl ethyl ketone (MEK), acetone, diethyl ketone, methyl isopropyl ketone (MIPK), or cyclohexanon, alcohols solvent such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), cellosolve™ solvent such as methyl cellosolve, ethyl cellosolve, or phenyl cellosolve, aliphatic hydrocarbons solvent such as hexane, pentane, heptane, or cyclohexane, aromatic hydrocarbons solvent such as toluene, xylene, or benzene, heteroaromatic solvent such as pyridine, pyrazine, furan, pyrrole, thiophene, or methylpyrrolidone, amide solvent such as N. N-dimethylformamide (DMF) or N,N-dimethylacetamide (DMA), halogenated compounds solvent such as dichloromethane, chloroform, or 1,2-dichloroethane, esters solvent such as ethyl acetate, methyl acetate, or ethyl formate, sulfur compounds solvent such as dimethyl sulfoxide (DMSO) or sulfolane, nitrile solvent such as acetonitrile, propionitrile, or acrylonitrile, organic acids solvent such as formic acid, acetic acid, trichloroacetic acid, or trifluoroacetic acid, or mixed solvent including the above can be cited.

<B> If the gate electrode 7 is composed of an inorganic material, dispersion liquid including particles of the inorganic material (metallic particles) can be used as the ink. In particular, those composed mainly of Ag are preferable for the particles of the inorganic material (metallic particles). By using such particles composed mainly of Ag, the ink can easily be prepared, and further, high conductivity can be obtained in the resulting gate electrode 7. In this case, the content of the particles of the inorganic material in the ink is not particularly limited, but is preferably in a range of about 1 through 40 wt %, and further preferably in a range of about 10 through 30 wt %.

Further, the average particle diameter of the inorganic material particles is not particularly limited, but is preferably in a range of about 1 through 100 nm, and is further preferably in a range of about 2 through 30 nm. Further, particles coated with a coagulation inhibition agent (a dispersing agent) for inhibiting coagulation in room temperature are preferably used for the inorganic material particles. As the coagulation inhibition agent, for example, compounds having a group including a nitrogen atom such as alkylamine, compounds having a group including a oxygen atom such as alkanediol, and compounds having a group including a sulfur atom such as alkylthiol or alkanethiol can be cited.

In this case, a remover capable of removing the coagulation inhibition agent by a predetermined process (e.g., heating or the like) is added into the ink. As the remover, for example, various carbonic acid including straight type or branched type of saturated carbonic acids with carbon number of 1 through 10 such as formic acid, acetic acid, proponic acid, butanoic acid, hexanoic acid, or octylic acid, unsaturated carbonic acids such as acrylic acid, methacrylic acid, crotonic acid, cinnamic acid, benzoic acid, or sorbic acid, dibasic acids such as oxalic acid, malonic acid, sebacic acid, maleic acid, fumaric acid, or itaconic acid, organic acids including various phosphoric acids and various sulfonic acids substituting the carboxyl groups of the above carbonic acids with phosphate groups or sulfonyl groups, esters derived from the above organic acids, aromatic acid anhydrides such as phthalic anhydride, trimellitic anhydride, pyromellitic dianhydride, benzophenone tetracarboxylic dianhydride, ethylene glycol bis(anhydro trimelitate), or glycerol tris(anhydro trimelitate), cyclic fatty acid anhydrides such as maleic anhydride, succinic anhydride, tetrahydrophtharic anhydride, methyltetrahydrophtharic anhydride, methyl nadic anhydride, alkenyl succinic anhydride, hexahydro phthalic anhydride, methylhexahydro phthalic anhydride, or methylsyclohexene tetracarboxylic dianhydride, fatty acid anhydrides such as polyadipic anhydride, polyazelaic anhydride, or polysebacic anhydride can be cited.

As the dispersion medium, for example, terpineol, mineral spirit, xylene, toluene, ethyl benzene, mesitylene, hexane, heptane, octane, decane, dodecane, cyclohexane, cyclooctane, ethanol, isopropanol (IPA), water, or mixed fluid including the above can be used.

Further, precursors of various thermoset resins such as phenol resin, epoxy resin, unsaturated polyester resin, vinylester resin, diallyl phthalate resin, oligoester acrylate resin, xylene resin, bismaleimide triazine resin, furan resin, urea resin, polyurethane resin, melamine resin, silicone resin can be added into (mixed with) the ink. It should be noted that the viscosity of the ink can be controlled by, for example, arranging the content of the inorganic material particles, the nature or the composition of the dispersion medium, or presence or absence or the nature of the additives.

<C> In case of forming the gate electrode 7 with a metallic material, dispersion liquid including a reducing agent and metal oxide particles composed of metal oxide that becomes a metal material by being reduced can be used as the ink. In this case, the content of the particles of the metal oxide in the ink is not particularly limited, but is preferably in a range of about 1 through 40 wt %, and further preferably in a range of about 10 through 30 wt %. Further, the average particle diameter of the metal oxide particles is not particularly limited, but is preferably no greater than 100 nm, and is further preferably no greater than 30 nm.

Further, as the reducing agent, for example, ascorbic acid, hydrogen sulfide, oxalic acid, and carbon monoxide can be cited. As the dispersion medium, for example, low viscosity oils such as butyl cellosolve or polyethylene glycol, alcohols such as 2-propanol, or mixed fluid including the above can be used. Note that the viscosity of the ink can be controlled by, for example, arranging the content of the metal oxide particles, the nature or the composition of the dispersion medium.

<D> If the gate electrode 7 is composed of metal oxide, solution including the precursor of the metal oxide can be used as the ink. As the precursor of the metal oxide to be used, for example, organic metallic compounds such as metal alkoxide or metallic salt of acetic acid or acetic acid derivatives, inorganic metallic compounds such as a metallic chloride, a metallic sulfide, or a metallic cyanide can be cited, and one or more of these precursors can be used alone or in combination.

The concentration (content) of the precursor of the metal oxide in the ink is not particularly limited, but is preferably in a range of about 1 through 50 wt %, and further preferably in a range of about 10 through 30 wt %. Further, as the solvent, for example, water, polyhydric alcohols such as ethylene glycol, glycerine, diethylene glycol, or triethanolamine, or monoalcohols such as methanol, ethanol, isopropanol, butanol, allyl alcohol, furfuryl alcohol, ethylene glycol monoacetate, or mixed fluid including the above can be used.

Note that the viscosity of the ink can be controlled by, for example, arranging the concentration of the precursor of the metal oxide, the nature or the composition of the solvent.

After going through the steps described above, the thin film transistor shown in FIGS. 1A and 1B can be obtained.

In such a manufacturing method, since the electroless plating process is used as the method of forming the source electrode 3 and the drain electrode 4 while each of the organic semiconductor layer 5, the gate insulating layer 6, and the gate electrode 7 is formed using the coating method, any large-scale equipments such as a vacuum equipment are not required, thus the thin film transistor 1 can be manufactured by simple processes at a lower cost.

Further, by using the electroless plating process as the method of forming the source electrode 3 and the drain electrode 4, these electrodes can be formed with high dimensional accuracy, thus the thin film transistor 1 can be of superior characteristics (switching characteristics). Further, by using the plating solution substantially free of any alkali metallic ions as the plating solution 10 used for the electroless plating process, interfusion of the alkali metallic ions to the source electrode 3 and the drain electrode 4 can be prevented, thus preventing the alkali metallic ions from diffusing into the organic semiconductor layer 5. Thus, the characteristics of the organic semiconductor layer 5 can be prevented from deteriorating, and as a result, the thin film transistor 1 having superior characteristics as a switching element can be manufactured.

Further, by providing the step of removing organic matters described in the step of [A2], the characteristics of the thin film transistor 1 is further enhanced.

Still further, by using the atmospheric pressure plasma as the method of removing organic matters in the step of [A2], and by using the wet-etching process as the method of removing the plated film 8 in the step of [A1], it is possible to execute all of the manufacturing steps of the thin film transistor 1 under the atmospheric pressure, thus reducing the manufacturing cost as well as the manufacturing time.

A second exemplary manufacturing method (a second exemplary embodiment of a method of manufacturing a thin film transistor according to the invention) of the thin film transistor 1 shown in FIGS. 1A and 1B is described herein.

FIGS. 5A through 5D are views (vertical cross-sectional views) for explaining the second manufacturing method of the thin film transistor shown in FIGS. 1A and 1B. Note that the upper side of FIGS. 5A through 5D is referred to as upper side and the lower side thereof is referred to as lower side in the following descriptions.

Hereinafter, the second manufacturing method is described with a focus mainly on the differences from the first manufacturing method described above, and the descriptions regarding the common matters are omitted.

In the second manufacturing method, the steps of forming the source electrode and the drain electrode are different from, and others are common to, the first manufacturing method.

[B1] the Step of Forming the Source Electrode and the Drain Electrode (the First Step)

[B1-I] Firstly, the substrate 2 is washed as in the step of [A1-I].

Then, a pre-process (e.g., a process for enhancing the adhesiveness of the resist layer 9 with the substrate 2) for forming the plated film 8 is executed on the substrate 2. As the pre-process, a primer treatment using silazanes such as hexamehtyldisilazane (HMDS), chlorosilanes such as dimethylchlorosilane or trimethylchlorosilane, alkoxysilanes such as dimethyldimethoxysilane or hexyltrimethoxysilane, titanate coupling agent, and so on can be cited.

Figure 5A:
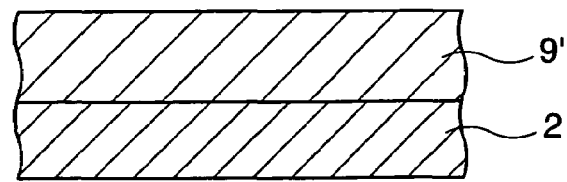
FIGS. 5A through 5D are views (vertical cross-sectional views) for explaining the second manufacturing method of the thin film transistor shown in FIGS. 1A and 1B.
Figure 5B:
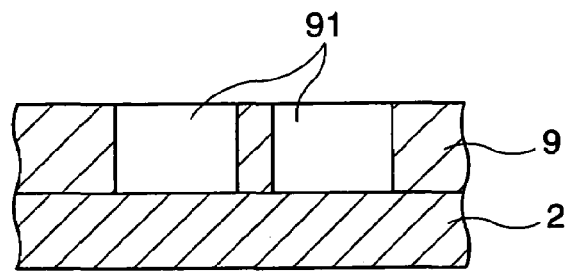

[B1-II] Subsequently, the resist layer (mask) 9 is formed in an area other than the area for forming the source electrode 3 and the drain electrode 4. Firstly, as shown in FIG. 5A, resist material 9' is deposited (provided) on the substrate 2. Then, it is exposed via a photo mask corresponding to the shapes of the source electrode 3 and the drain electrode 4, and then developed by developing fluid. According to the above, as shown in FIG. 5B, the resist layer 9 patterned to have the shape corresponding to the area except for the area for forming the source electrode 3 and the drain electrode 4 can be obtained.

A plating layer is not formed on the resist layer 9, and in order to selectively form the source electrode 3 and the drain electrode 4, the metallic catalytic agent needs to be selectively absorbed to the substrate in the following step. To that end, the difference (contrast) in the charge conditions between the surface of a glass (or the substrate) and the resist layer 9 is preferably large. In case the substrate is made of glass, the substrate is generally charged negatively. The resist layer 9 is preferably charged positively. As such a resist material, for example, commercial items, such as "PMER series" produced by Tokyo Ohka Kogyo Co., Ltd can be used. The charge control agent is further preferably added to the resist material to further stabilize the positive charge. Further, the contrast of the charge can be enhanced by absorbing the surface-active agent.

[B1-III] Subsequently, pre-processing for forming a plated film 8 is executed on the substrate 2.

A plating layer is not formed on the resist layer 9, and surface modification by substrate cleaning is executed, before all, as a pre-process for using a method of selectively forming the plated film 8 on the substrate 2 in the area for forming the source electrode 3 and the drain electrode 4. As the method therefor, UV irradiation is executed. For example, it is fully irradiated with the UV having the wave length in a range of 254 through 360 nm. Subsequently, the submerged surface potential of the substrate and the submerged surface potential of the resist layer are controlled to generate difference using a specific surface-active agent to the substrate and the resist layer. For example, in case the substrate is made of glass and "PMER series" produced by Tokyo Ohka Kogyo Co., Ltd mentioned above in [B1-II] is used for the resist, amine-anionic surface-active agent is used.

As the method of bringing the surface-active solution into contact with the substrate 2, for example, a method of dipping the substrate 2 into the surface-active solution (a dipping method) and a method of spraying the surface-active solution onto the substrate 2 can be cited. The dipping method is particularly preferable. According to the dipping method, a large number of the substrate 2 can easily be processed. The temperature of the surface-active solution in use is preferably in a range of about 0 through 70° C., and further preferably in a range of about 10 through 40° C. Further, the process time of the substrate 2 in the surface-active solution is preferably in a range of about 10 through 90 seconds, and further preferably in a range of about 30 through 60 seconds. The substrate 2 thus pre-processed is washed using, for example, purified water (ultra pure water), ion exchanged water, distilled water, or RO water.

[B1-IV] Then, a process, in which the metallic catalytic agent is selectively absorbed to the area with no resist on the substrate 2, namely the area where the submerged surface potential of the substrate matches the metallic catalytic agent, is executed. As the catalytic agent, Au, Ag, Pd, Pt and so on can be cited. In case, for example, Pd among these agents is used as the catalytic agent, the Pd catalytic agent is absorbed onto the surface of the substrate 2 by dipping the substrate 2 in an ionic Pd catalytic agent such as palladium chloride. The temperature of the solution including the catalytic agent in use is preferably in a range of about 0 through 70° C., and further preferably in a range of about 10 through 40° C.

The process time of the substrate 2 in the solution including the catalytic agent is preferably in a range of about 10 seconds through 5 minutes, and further preferably in a range of about 20 seconds through 3 minutes. The substrate 2, to which the catalytic agent is thus attached (absorbed), is washed using, for example, purified water (ultra pure water), ion exchanged water, distilled water, or RO water.

Figure 5C:
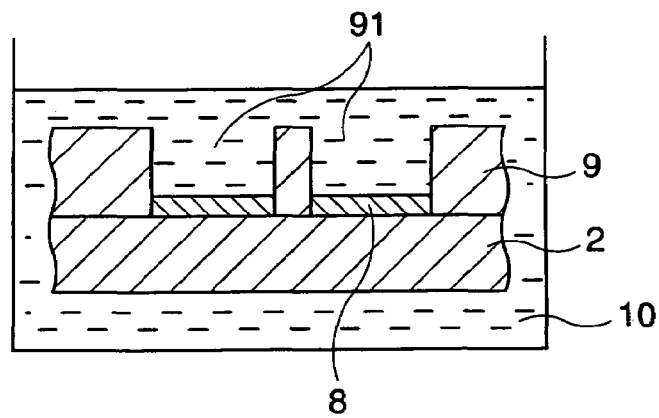

[B1-V] Subsequently, as shown in FIG. 5C, the metallic element is deposited inside hollow sections (openings) 91 of the resist layer 9 to form the plating film 8.

Figure 5D:
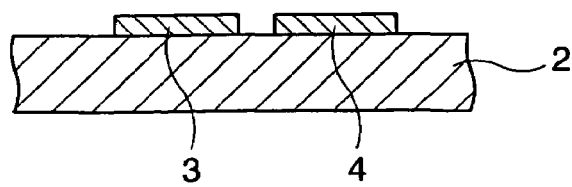

This process can be executed similarly to the step of [A1-IV]. The resist layer 9 is then removed. According to this process, as shown in FIG. 5D, the source electrode 3 and the drain electrode 4 are formed. According to the second manufacturing method, the same performance and advantages as in the first manufacturing method can also be obtained. Further, in the second manufacturing method, since the etching process of the plated film 8 can be omitted in the source electrode and the drain electrode forming process, the manufacturing processes can further be simplified. Further, in the second manufacturing method, since the source electrode 3 and the drain electrode 4 can selectively be formed, consumption of the plating solution can also be reduced.

A second configuration (a second exemplary embodiment) of a thin film transistor according to the present invention is hereinafter explained.

Figure 6A:
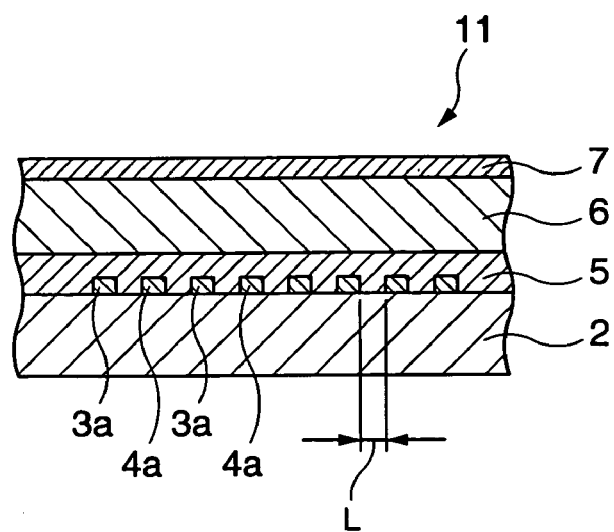
Figure 6B:
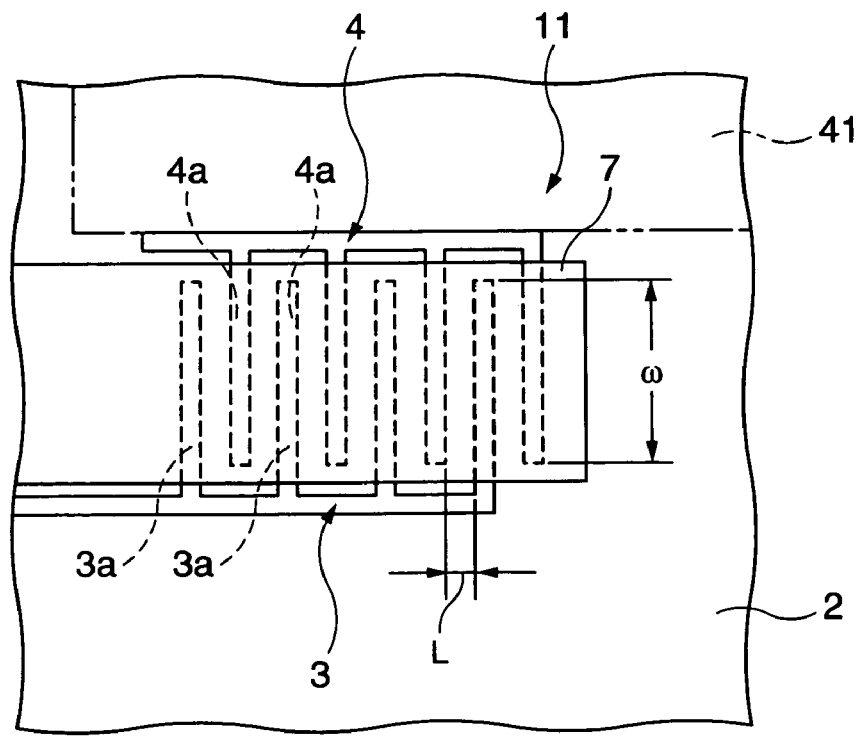

FIGS. 6A and 6B are views showing the thin film transistor of the second configuration, in which FIG. 6A is a vertical cross-sectional view, and FIG. 6B is a plan view. Note that the upper side of FIG. 6A is referred to as upper side and the lower side thereof is referred to as lower side in the following descriptions.

Hereinafter, the second configuration of the thin film transistor and manufacturing method thereof is described with a focus mainly on the differences from the first configuration and the first and second manufacturing methods described above, and the descriptions regarding the common matters are omitted.

The thin film transistor 11 of the second configuration is different in shapes of the source electrode 3 and the drain electrode 4 from, and is the same in others as the thin film transistor 1 of the first configuration. Namely, in the transistor 11 shown in FIGS. 6A and 6B, both of the source electrode 3 and the drain electrode 4 shape like comb teeth, and formed so that the comb teeth of one electrode engages with those of the other. More specifically, the source electrode 3 and the drain electrode 4 respectively have electrode fingers 3a and 4a each aligned with a predetermined pitch and forming the comb-like shape as a whole. And further, these source electrode 3 and drain electrode 4 are provided so that the electrode fingers 3a and 4a are aligned alternately.

Further, the gate electrode 7 is provided on the gate insulating layer 6 so as to overlap the area where the electrode fingers 3a and 4a are aligned alternately. In the thin film transistor 11, a part of the organic semiconductor layer 5 positioned between each of the electrode fingers 3a of the source electrode 3 and each of the electrode fingers 4a of the drain electrode 4 is defined as a channel region through which carriers are transferred. Further, the length in the carrier transfer direction in the area between each of the electrode fingers 3a of the source electrode 3 and each of the electrode fingers 4a of the drain electrode 4, namely the distance between each of the electrode fingers 3a and 4a corresponds to the channel length L, and the product of the length ω in the direction perpendicular to the channel length direction and the number N of the distances (gaps) between the electrode fingers 3a and 4a makes the channel width W.

The width A of each of electrode fingers 3a and 4a is preferably equal to or less than 20 μm, and further preferably equal to or less than 10 μm. Further, the channel length L is preferably equal to or less than 20 μm, and further preferably equal to or less than 10 μm. The channel width W can be the same as in the first configuration.

The thin film transistor 11 can be manufactured through similar steps to the first manufacturing method except that the resist layer 9 for patterning the plated film 8 is formed in accordance with the pattern shaped like the comb-teeth in the step of [B1] forming the source electrode and the drain electrode. Further, it can be manufactured through similar steps to the second manufacturing method except that the resist layer 9 is formed in accordance with the pattern shaped like the comb-teeth in the step of [B1] forming the source electrode and the drain electrode.

According to the thin film transistor 11 of the second exemplary configuration, the same performance and advantages as the thin film transistor 1 of the first configuration can also be obtained. Note that, generally in thin film transistors, since sections where the source electrodes or the drain electrodes overlap the gate electrodes function as capacitors, as the areas of the overlapping sections increase, the capacitances of the gate electrodes increase to make it difficult to be driven faster. In case the gate electrode is formed by a coating method, since it is difficult to form a narrower pattern than 20 micron from the limit of the resolution, the area of the overlapping section must have been large in related structures.

In contrast, in the thin film transistor 11 in which the source electrode 3 and the drain electrode 4 are formed like the comb teeth and the areas between respective electrode fingers 3a and 4a are defined as the channel region, the area of the section where the gate electrode 7 overlaps the source electrode 3 or the drain electrode 4 is determined by the width A of the electrode fingers 3a and 4a. And, in the invention, the source electrode 3 and the drain electrode 4 are formed using the resist layer formed by lithography process as a mask. Therefore, the width A of the electrode fingers 3a and 4a depends on the resolution of the lithography process, and since the resolution of the lithography process is extremely high, the width A can be narrowed.

According to this, even in case the gate electrode 7 is formed to have relatively large width, the area of the section where the gate electrode 7 overlaps the source electrode 3 or the drain electrode 4 can be prevented from increasing. Thus, in the thin film transistor 11, the gate capacitance can be held to a lower value, and consequently, good characteristics (switching characteristics) can be obtained. As described above, since the gate electrode 7 is not required to be formed in a fine shape in the present embodiment, the process can be selected from wider alternatives, and even if various kind of coating method is used for forming the gate electrode 7, the thin film transistor 11 having good characteristics can be obtained.

An electronic device equipped with an active matrix device having thin film transistors 1, 11 as described above is now described using an electrophoretic display device as an example.

Figure 7:
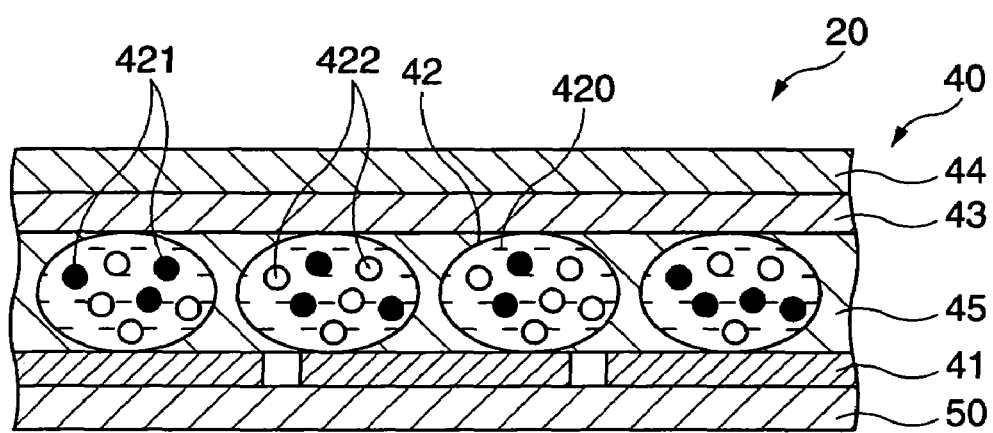
FIG. 7 is a vertical cross-sectional view showing an embodiment of applying an electronic device according to the present invention to an electrophoretic display device.
Figure 8:
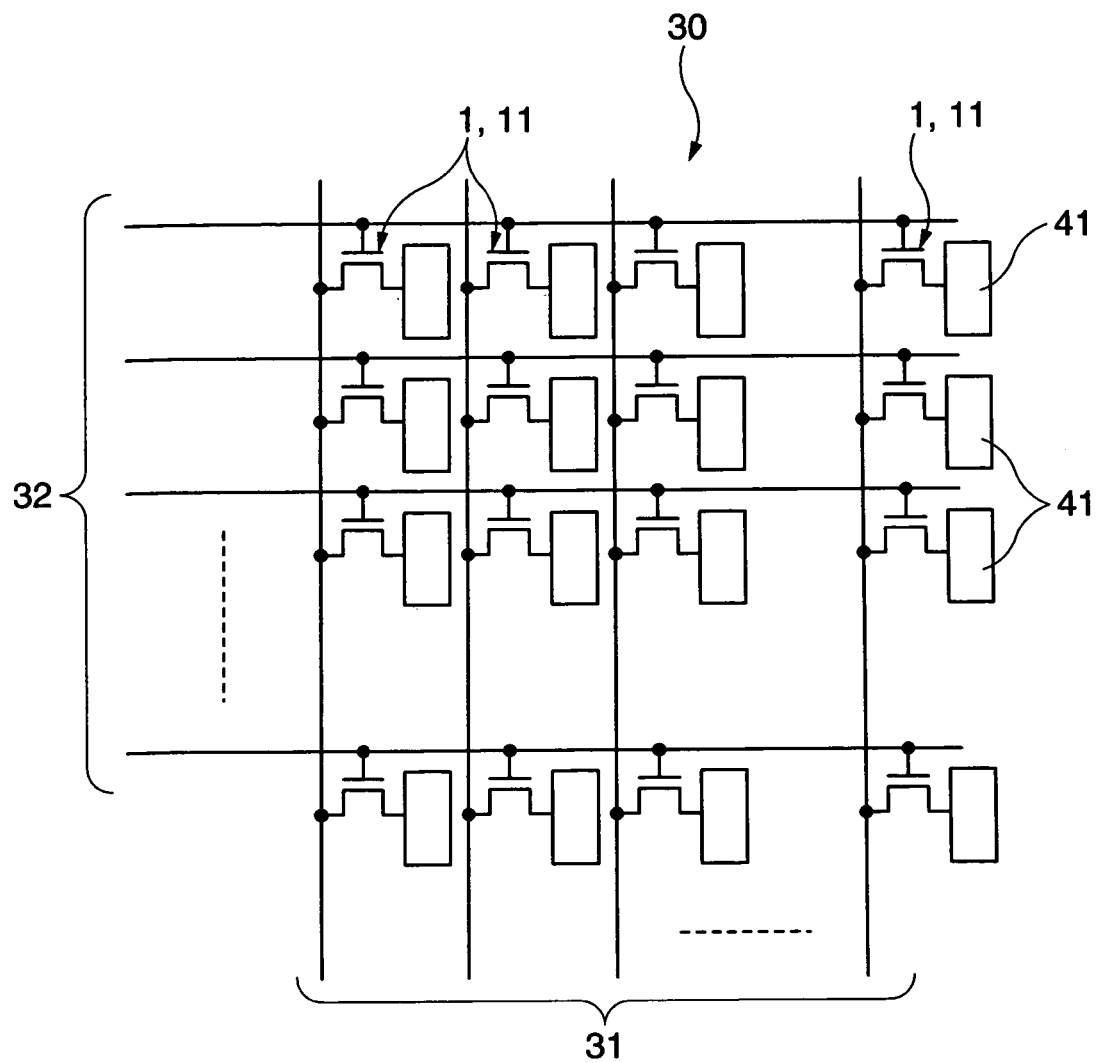
FIG. 8 is a block diagram showing a configuration of an active matrix device provided to the electrophoretic display device shown in FIG. 7.

FIG. 7 is a vertical cross-sectional view showing an embodiment in case an electronic device according to the present invention is applied to an electrophoretic display device. FIG. 8 is a block diagram showing a configuration of an active matrix device installed in the electrophoretic display device shown in FIG. 7.

The electrophoretic display device 20 shown in FIG. 7 is composed of an active matrix device (a transistor circuit according to the present invention) 30 provided on a substrate 50 and an electrophoretic display section 40 electrically connected to the active matrix device 30.

As shown in FIG. 8, the active matrix device 30 comprises a plurality of data lines 31, a plurality of scanning lines 32 perpendicular to the plurality of data lines, and the thin film transistors 1, 11 provided adjacent to each of the intersections of the data lines 31 and the scanning lines 32.

And, the gate electrodes 7, the source electrodes 3, and the drain electrodes 4 provided in the thin film transistors 1, 11 are respectively connected to the scanning lines 32, the data lines 31, and pixel electrodes (discrete electrodes) 41 described below. As shown in FIG. 7, the electrophoretic display section 40 comprises the pixel electrode 41, a micro capsule 42, a transparent electrode (a common electrode) 43 and a transparent substrate 44 sequentially stacked on the substrate 50.

Further, the micro capsule 42 is fixed between the pixel electrode 41 and the transparent electrode 43 with a binder member 45. The pixel electrode 41 is divided into a matrix, namely so as to be aligned vertically and horizontally with regularity. In each of the capsules 42, electrophoretic dispersion liquid 420 including plural kinds of electrophoretic particles having different characteristics from each other, two kinds of electrophoretic particles 421 and 422 having different charges and colors (hues) in the exemplary embodiment.

In the electrophoretic display device 20 as described above, if one or more of the scanning lines are supplied with selection signals (selection voltages), the thin film transistors 1, 11 connected to the scanning lines supplied with the selection signals (selection voltages) are switched on. Thus, the data lines 31 connected to this thin film transistor 1, 11 and the pixel electrodes 41 are substantially electrically connected. In this case, if the desired data (voltage) is supplied to the data line 31, the data (voltage) is then supplied to the pixel electrode 41.

Accordingly, electric field is generated between the pixel electrode 41 and the transparent electrode 43, and the electrophoretic particles 421 and 422 are electrophoresed toward either of the electrodes in accordance with the direction and strength of the electric field, the characteristics of the electrophoretic particles 421 and 422, and so on. Meanwhile, in this state, when the supply of the selection signal (selection voltage) to the scanning line 32 is stopped, the thin film transistors 1, 11 are switched off bringing the data lines 31 and the pixel electrodes 41 connected to the thin film transistors 1, 11 into an electrically disconnected state.

Therefore, by executing supplying or stopping the selection signals to the scanning lines 32, and supplying or stopping the data to the data lines 31 in combination, desired images (information) can be displayed on the display surface side (the transparent substrate 44 side) of the electrophoretic display device 20. In particular, in the electrophoretic display device 20 according to the present embodiment, the electrophoretic particles 421 and 422 are differently colored, thus enabling images with multiple depths to be displayed.

Further, since the electrophoretic display device 20 according to the exemplary embodiment is equipped with the active matrix device 30, the thin film transistor 1, 11 connected to a specific scanning line 32 can selectively be switched ON/OFF, thus the problem of cross-talk is difficult to arise, and further, the faster circuit operation is possible, which can obtain high quality images (information). Further, since the electrophoretic display device 20 according to the present embodiment can operate with lower drive voltages, lower power consumption can be realized. It should be noted that the electronic device according to the present invention is not limited to the application to the electrophoretic display device 20 as described above, but can also be applied to liquid crystal display devices, organic or inorganic EL display devices and so on.

The electrophoretic display device 20 as described above can be installed in various electronic apparatuses. The electronic apparatus according to the present invention equipped with the electrophoretic display device 20 is hereinafter described.

Firstly, an exemplary embodiment of applying the electronic apparatus of the invention to the electronic paper is explained.

Figure 9:
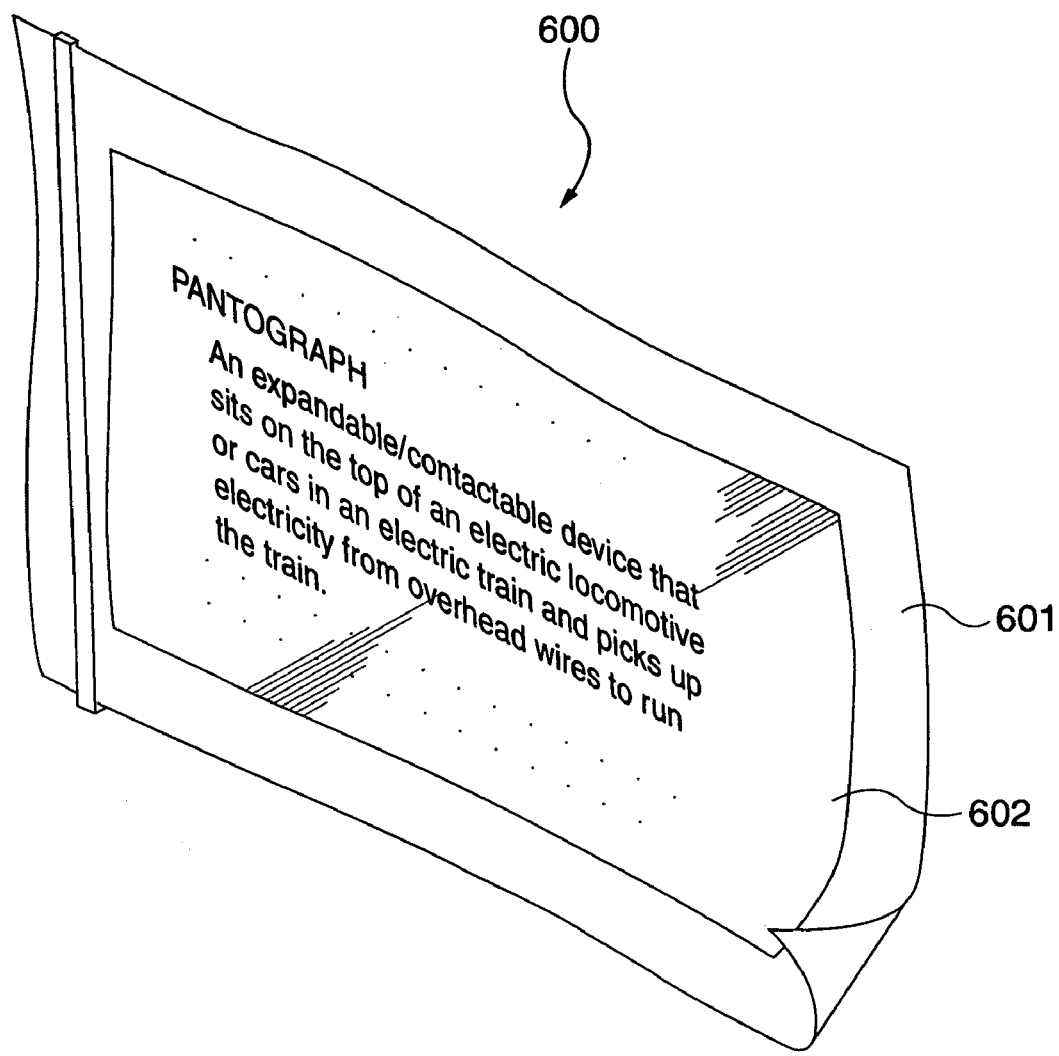
FIG. 9 is a perspective view showing an embodiment of applying the electronic apparatus according to the present invention to an electronic paper.

FIG. 9 is a perspective view showing the embodiment of applying the electronic apparatus of the present invention to the electronic paper.

The electronic paper 600 shown in this drawing is equipped with a main body 601 composed of a rewritable sheet offering the same feeling of quality and having the same flexibility as paper and a display unit 602. In the electronic paper 600 as described above, the display unit 602 is composed of the electrophoretic display device 20 as described above.

Figure 10A:
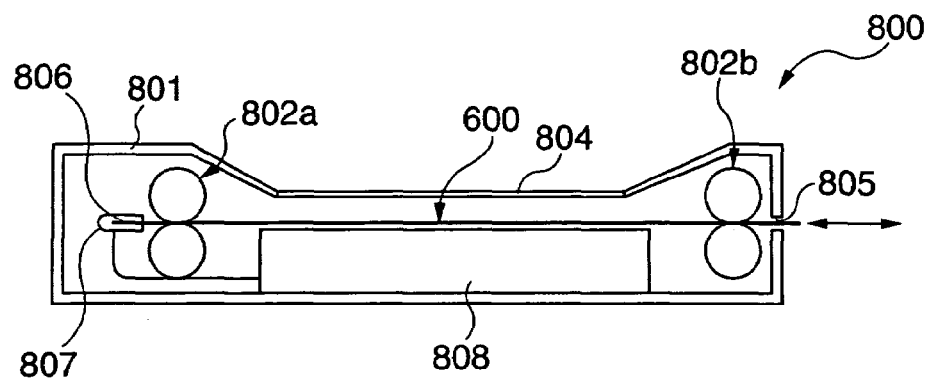
FIGS. 10A and 10B are schematic views showing an embodiment of applying the electronic apparatus according to the present invention to a display.
Figure 10B:
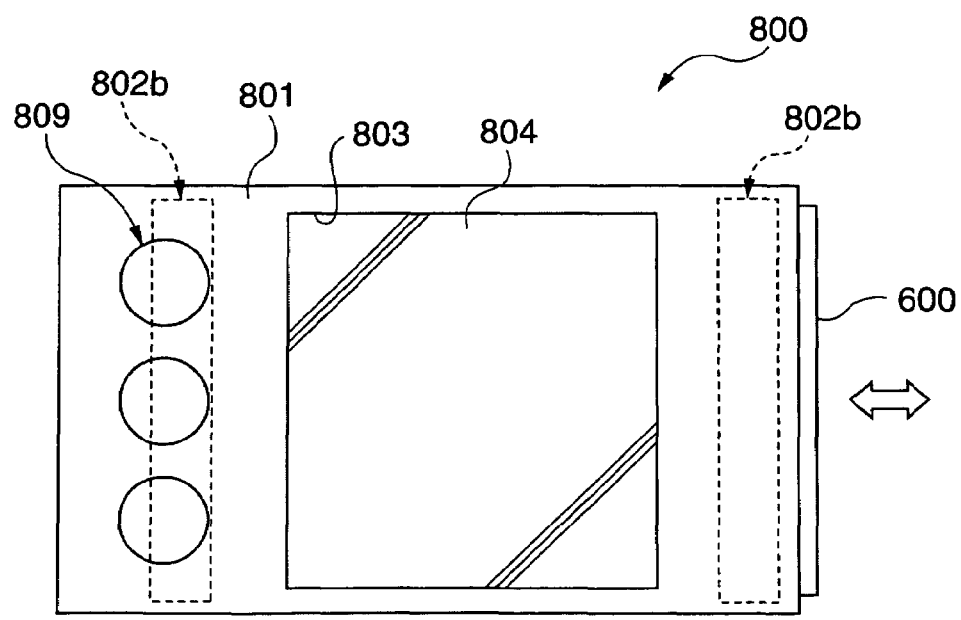

Then, an embodiment of applying the electronic apparatus of the present invention to a display is explained. FIGS. 10A and 10B are views showing the embodiment of applying the electronic apparatus of the present invention to the display, where FIG. 10A is a cross-sectional view, and FIG. 10B is a plan view.

The display 800 shown in the drawing is equipped with a main body 801 and the electronic paper 600 detachably mounted on the main body 801. Note that the configuration of the electronic paper 600 is as described above, namely the same as the configuration shown in FIG. 9.

The main body 801 is provided with an inlet 805 at a side thereof (right side of the figure) through which the electronic paper 600 can be inserted, and with two pairs of feed rollers 802a and 802b inside thereof. When the electronic paper 600 is inserted in the main body 801 through the inlet 805, the electronic paper 600 is positioned in the main body 801 while being held by the pairs of feed rollers 802a and 802b.

Further, in the display side (the near side of the paper in FIG. 10B) of the main body 801, there is formed a rectangular hollow section 803, in which a transparent glass plate 804 is engaged. Thus, the electronic paper 600 inserted and positioned in the main body 801 can be watched from outside the main body 801. Namely, in the display 800, the display surface is realized by making the electronic paper 600 positioned in the main body 801 be watched through the transparent glass plate 804.

Further, a terminal section 806 is provided on the tip portion of the electronic paper 600 in the inserting direction (left side in the figure), and a socket 807 is provided inside the main body 801, to which the terminal section 806 is connected when the electronic paper 600 is positioned in the main body 801. The socket 807 is electrically connected to a controller 808 and an operation section 809. In the display 800, since the electronic paper 600 is detachably mounted on the main body 801, it can also be carried and used while being detached from the main body 801.

Further, in the display 800 described above, the electronic paper 600 is composed of the electrophoretic display device 20 as described above. Note that the application of the electronic apparatus according to the present invention is not limited to those as described above, but includes, for example, a television, a video cassette recorder of either a view-finder type or a direct view type, a car navigation system, a pager, a personal digital assistance, an electronic calculator, an electronic newspaper, a word processor, a personal computer, a workstation, a picture phone, a POS terminal, devices equipped with touch panels, and the electrophoretic display device 20 can be applied to display sections of the above various electronic apparatuses.

As the above, although the method of manufacturing the thin film transistor, the thin film transistor, the thin film transistor circuit, the electronic device, and the electronic apparatus according to the invention are described, it should be understood that the invention is not limited to these embodiments. For example, although the thin film transistor is described using the top-gate structure type as an example in the embodiment, the invention can also be applied to thin film transistors of the bottom-gate type. In this case, the gate electrode is formed using the electroless plating process.

Further, in the manufacturing method of the thin film transistor according to the present invention, one or more of steps of desired purposes can be added if necessary. Further, configuration of each section of the thin film transistor, the thin film transistor circuit, the electronic device, and the electronic apparatus can be replaced with a desired configuration capable of comparably functioning thereto or added a desired configuration.

Specific examples according to the present invention are hereinafter described.

1. Structure of Thin Film Transistor

In the following examples, purified water is used as water unless otherwise described.

EXAMPLE 1

Firstly, a glass substrate with a thickness of 1 mm is provided, and washed with water (cleaning fluid). Then, the glass substrate is dipped in an aqueous solution (25° C.) of distearyl dimethyl ammonium chloride (cationic surface-active agent) for 60 seconds. Thus, distearyl dimethyl ammonium chloride is absorbed on the surface of the glass substrate. Subsequently, the glass substrate is washed with water.

Then, the glass substrate is dipped in a Sn-Pd colloidal suspension (25° C.) for 60 seconds. Thus, Sn-Pd is absorbed on the surface of the glass substrate. Subsequently, the glass substrate is washed with water. Then, the glass substrate is dipped in an aqueous solution (25° C.) including $HBF_4$ and glucose for 60 seconds. Thus, Sn is removed from the surface of the glass substrate to expose Pd on the surface of the glass substrate. Subsequently, the glass substrate is washed with water.

Then, the glass substrate is dipped in a Ni plating solution (80° C., pH 8.5) for 60 seconds. Thus, a Ni plated film with a thickness of 100 nm is formed on the surface of the glass substrate. Note that the Ni plating solution is prepared by dissolving 10 g of nickel sulfate, 100 g of hydrazine (a reducing agent), 5 g of ammonium sulfide (a pH adjuster) with 1 L of water.

And then, a resist layer patterned correspondingly to the shapes of the source electrode and the drain electrode is formed on the Ni plated film by a lithography process. Note that "OPR800" produced by Tokyo Ohka Kogyo Co., Ltd is used as the resist material. And then, the glass substrate is dipped in an aqueous solution (25° C.) of iron chloride. Thus, the plated film not covered by the resist layer is removed to form the source electrode and the drain electrode. It should be noted that the distance (the channel length L) between the source electrode and the drain electrode is arranged to be 20 μm, and the channel width W is arranged to be 1 mm.

Then, after removing the resist layer using the resist remover, the glass substrate with the source electrode and the drain electrode formed thereon is sequentially washed with water and methanol. And then, the oxygen plasma process (the atmospheric pressure oxygen plasma process) is executed on the substrate with the source electrode and the drain electrode formed thereon under the atmospheric pressure. It should be noted that, in the conditions of the atmospheric pressure plasma process, the RF power is set to be 0.05 W/cm$^2$ and the flow rate is set to be 80 sccm.

Subsequently, a 1% (wt/vol) toluene solution of F8T2 (fluorene-bithiophene copolymer) is coated on the glass substrate by the spin coating process (2400 rpm), and then dried at 60° C. for 10 minutes. Thus, the organic semiconductor layer with an average thickness of 50 nm is formed. And then, a 5% (wt/vol) butyl acetate solution of polymethylmethacrylate (PMMA) is coated on the organic semiconductor layer by the spin coating process (2400 rpm), and then dried at 60° C. for 10 minutes. Further, a 2% (wt/vol) isopropyl alcohol solution of polyvinylphenol is coated thereon by the spin coating process (2400 rpm), and then dried at 60° C. for 10 minutes. Thus, the gate insulating layer with an average thickness of 500 nm is formed. And then, a water dispersion (viscosity of 5 cps at room temperature) of PEDOT (poly-ethylenedioxythiophene) is coated on the gate insulating layer in an area corresponding to the region between the source electrode and the drain electrode by the inkjet process (20 pL droplet), and then dried at 80° C. for 10 minutes. Thus, the gate electrode with an average thickness of 100 nm is formed. The thin film transistor shown in FIGS. 1A and 1B is manufactured through the steps described above.

EXAMPLE 2 THROUGH 9

The thin film transistor shown in FIGS. 1A and 1B is manufactured similarly to the example 1 while changing the nature of the reducing agent, the nature of the pH adjuster, and presence or absence and/or the nature of the plasma process as shown in TABLE 1.

TABLE 1

| | Reducing agent | pH adjuster | Plasma process |
|---|---|---|---|
| Example 1 | Hydrazine | Ammonium sulfide | Atmospheric pressure oxygen plasma |
| Example 2 | Ammonium hypophosphite | Ammonium sulfide | Atmospheric pressure oxygen plasma |
| Example 3 | Hydrazine + Ammonium hypophosphite*[1] | Ammonium sulfide | Atmospheric pressure oxygen plasma |
| Example 4 | Hydrazine | Ammonia water | Atmospheric pressure oxygen plasma |
| Example 5 | Hydrazine | Trimethyl ammonium hydride | Atmospheric pressure oxygen plasma |
| Example 6 | Hydrazine | Ammonium sulfide + Trimethyl ammonium hydride*[2] | Atmospheric pressure oxygen plasma |
| Example 7 | Hydrazine | Ammonium sulfide | Atmospheric pressure Ar plasma |
| Example 8 | Hydrazine | Ammonium sulfide | Atmospheric pressure CF$_4$ plasma |
| Example 7 | Hydrazine | Ammonium sulfide | No |
| Example 8 | Ammonium hypophosphite | Ammonium sulfide | No |
| Example 9 | Hydrazine + Sodium hypophosphite*[3] | Ammonium sulfide | Atmospheric pressure oxygen plasma |
| Example 10 | Hydrazine | Ammonium sulfide | Atmospheric pressure oxygen plasma |
| Example 11 | Hydrazine | Ammonium sulfide | Atmospheric pressure oxygen plasma |
| Example 12 | Hydrazine | Ammonium sulfide | Atmospheric pressure oxygen plasma |

*[1]Hydrazine:Ammonium hypophosphite = 60:40 (weight ratio)
*[2]Ammonium sulfide:Trimethyl ammonium hydride = 70:30 (weight ratio)
*[3]Hydrazine:Sodium hypophosphite = 90:10 (weight ratio)

EXAMPLE 10

Firstly, a polyimide substrate with a thickness of 35 μm is provided, and washed with water (cleaning fluid). Subsequently, the polyimide substrate is dipped in an aqueous solution (25° C.) including $CrO_3$ and sulfuric acid for 60 seconds, and then dipped in an aqueous solution (25° C.) of ammonium sulfite hydrate 60 seconds as a pre-process.

And then, a resist layer having a pattern corresponding to the area other than the area in which the source electrode and the drain electrode are to be formed is formed on the polyimide substrate by a lithography process. Note that "PMERP-NZ30" produced by Tokyo Ohka Kogyo Co., Ltd is used as the resist material. Then, the plated film is formed similarly to the example 1. Note that the distance (the channel length L) between the source electrode and the drain electrode is arranged to be 20 μm, and the channel width W is arranged to be 1 mm.

Then, after removing the resist layer using the resist remover, the polyimide substrate with the source electrode and the drain electrode formed thereon is sequentially washed with water and methanol. And then, the oxygen plasma process (the atmospheric pressure oxygen plasma process) is executed thereon under the atmospheric pressure similarly to the example 1. Subsequently, the organic semiconductor layer, the gate insulating layer, and the gate electrode are respectively formed on the polyimide substrate similarly to the example 1.

The thin film transistor shown in FIGS. 1A and 1B is manufactured through the steps described above.

EXAMPLE 11

After providing the source electrode, the drain electrode, the organic semiconductor layer, and the gate insulating layer similarly to the example 1, a water dispersion (viscosity of 6 cps at room temperature) of Ag fine particles is coated on the gate insulating layer in an area corresponding to the region between the source electrode and the drain electrode by the inkjet process (20 pL droplet), and then calcined in the atmosphere at 120° C. for 60 minutes. Thus, the gate electrode with an average thickness of 800 nm is formed.

EXAMPLE 12

After forming the source electrode and the drain electrode similarly to the example 1, a 1% (wt/vol) toluene solution of polyarylamine is coated by the spin coating process, and then dried on a hotplate. Thus, the organic semiconductor layer with an average thickness of 50 nm is formed.

And then, a 5% (wt/vol) butyl acetate solution of polymethylmethacrylate (PMMA) is coated on the organic semiconductor layer by the spin coating process (2400 rpm), and then dried at 60° C. for 10 minutes. Further, a 2% (wt/vol) isopropyl alcohol solution of polyvinylphenol is coated thereon by the spin coating process (2400 rpm), and then dried at 60° C. for 10 minutes. Thus, the gate insulating layer with an average thickness of 500 nm is formed.

And then, a water dispersion (viscosity of 5 cps at room temperature) of PEDOT (poly-ethylenedioxythiophene) is coated on the gate insulating layer in an area corresponding to the region between the source electrode and the drain electrode by the inkjet process (20 pL droplet), and then dried at 80° C. for 10 minutes. Thus, the gate electrode with an average thickness of 100 nm is formed. The thin film transistor shown in FIGS. 1A and 1B is manufactured through the steps described above.

2. Evaluation

A threshold voltage, a drain current value at a gate voltage value of −40 V, and the S value of each thin film transistor manufactured in the respective examples are measured. It should be noted that the threshold voltage denotes a gate voltage value when the value of the approximate expression (relational expression) expressing the relationship between the gate voltage and $Id^{1/2}$ (Id: drain current value) makes zero, which can be assumed as a gate voltage value necessary for the drain current to start flowing. Further, the S value denotes a gate voltage value necessary for the drain current value to increase as much as one digit.

Therefore, a thin film transistor with the lower absolute value of the threshold voltage, the larger drain current value at a gate voltage value of −40 V, and the smaller S value is the thin film transistor with the better characteristics. These values are shown in TABLE 2.

TABLE 2

| | Threshold voltage value [V] | Drain current value [A] | S value [V/dec] |
|---|---|---|---|
| Example 1 | −2 | $8 \times 10^{-7}$ | 1.5 |
| Example 2 | −1 | $8 \times 10^{-7}$ | 1.1 |
| Example 3 | −2 | $8 \times 10^{-7}$ | 1.3 |
| Example 4 | −3 | $6 \times 10^{-7}$ | 1.7 |
| Example 5 | −2 | $7 \times 10^{-7}$ | 1.4 |
| Example 6 | −2 | $8 \times 10^{-7}$ | 1.3 |
| Example 7 | −2 | $8 \times 10^{-7}$ | 1.2 |
| Example 8 | −3 | $8 \times 10^{-7}$ | 1.4 |
| Example 7 | −5 | $2 \times 10^{-7}$ | 3 |
| Example 8 | −4 | $2 \times 10^{-7}$ | 3 |
| Example 9 | −4 | $2 \times 10^{-7}$ | 2.5 |
| Example 10 | −1 | $8 \times 10^{-7}$ | 1.2 |
| Example 11 | −2 | $8 \times 10^{-7}$ | 1.5 |
| Example 12 | 0 | $5 \times 10^{-7}$ | 4.1 |

As shown in TABLE 2, all of the thin film transistors manufactured in the above examples have small absolute values of the threshold voltage, the small S values, and large drain current values, and accordingly superior characteristics. In particular, the tendency is shown that the characteristics are improved by using the plating solution free of any sodium ions or by executing a plasma process on an electrode.

Note that, if the thin film transistor shown in FIGS. 1A and 1B is manufactured similarly to the above examples while changing the nature of gases or using a plurality of kinds of gases in the plasma process, and then similarly evaluated, the same results as of the above examples can be obtained.

Further, if the thin film transistor shown in FIGS. 6A and 6B is manufactured similarly to the above examples and then similarly evaluated, the same results as of the above examples can be obtained.

While this invention has been described in conjunction with the specific embodiments thereof, it is evident that many alternatives, modifications, and variations will be apparent to those skilled in the art. Accordingly, the preferred embodiments of the invention as set forth herein are intended to be illustrative, not limiting. There are changes that may be made without departing from the spirit and scope of the invention.

What is claimed is:

1. A method of manufacturing a thin film transistor, comprising:

forming a source electrode and a drain electrode on a substrate by an electroless plating process, the electroless plating process using a plating solution that is substantially free of alkali metallic ions;

forming an organic semiconductor layer in at least an area between the source electrode and the drain electrode using a coating method;

forming a gate insulating layer on the organic semiconductor layer using a coating method; and forming a gate electrode using a coating method so as to overlap an area on the gate insulating layer and an area between the source electrode and the drain electrode.

2. The method of manufacturing a thin film transistor according to claim 1, forming the source and drain electrodes further including that the source electrode and the drain electrode are selectively formed by providing the plating solution inside an opening of a mask provided on the substrate.

3. The method of manufacturing a thin film transistor according to claim 1, forming the source and drain electrodes further including that both of the source electrode and the drain electrode are formed like comb-teeth and arranged to engage with each other.

4. The method of manufacturing a thin film transistor according to claim 1, each of the source electrode and the drain electrode being composed mainly of one of Ni, Cu, Pd, Au, Pt, and an alloy including one of Ni, Cu, Pd, Au, and Pt.

5. The method of manufacturing a thin film transistor according to claim 1, further comprising prior to forming an organic semiconductor layer:

removing an organic matter existing in a side of the substrate surface where the organic semiconductor layer is to be formed.

6. The method of manufacturing a thin film transistor according to claim 5, the organic matter being removed by a plasma process.

7. The method of manufacturing a thin film transistor according to claim 6, the plasma process being executed under atmospheric pressure.

8. The method of manufacturing a thin film transistor according to claim 6, in the plasma process, plasma being generated using a gas composed mainly of at least one of oxygen, nitrogen, argon, helium, and fluorocarbon.

9. The method of manufacturing a thin film transistor according to claim 1, the organic semiconductor layer being composed mainly of a conjugated polymeric material.

10. The method of manufacturing a thin film transistor according to claim 9, the conjugated polymeric material being composed mainly of at least one of fluorene-bithiophene copolymer, polyarylamine, and derivatives thereof.

11. The method of manufacturing a thin film transistor according to claim 1, forming a gate electrode further including that an inkjet method is used as the coating method used for forming the gate electrode.

12. The method of manufacturing a thin film transistor according to claim 1, the gate electrode being composed mainly of an electrically conductive polymeric material.

13. The method of manufacturing a thin film transistor according to claim 1, the gate electrode being formed using a fluid including a metallic particle.

14. The method of manufacturing a thin film transistor according to claim 13, the metallic particle being composed mainly of Ag.

15. The method of manufacturing a thin film transistor according to claim 1, the substrate being a resin substrate composed mainly of a resin material, comprising prior to forming the source and drain electrodes:

executing an adhesiveness enhancing process that enhances adhesiveness with the source electrode and the drain electrode on a surface of the resin substrate where the source electrode and the drain electrode are to be formed.

16. The method of manufacturing a thin film transistor according to claim 15, the adhesiveness enhancing process comprising:

etching, with an etching fluid including a transition metal oxide and an inorganic acid, a surface of the resin substrate where the source electrode and the drain electrode are to be formed; and treating the surface of the resin substrate where the source electrode and the drain electrode are to be formed using a treatment fluid including a reducing agent substantially free of an alkali metal element.

17. The method of manufacturing a thin film transistor according to claim 16, the reducing agent being composed mainly of an ammonium compound.

18. The method of manufacturing a thin film transistor according to claim 17, the ammonium compound being an ammonium sulfite hydrate.

* * * * *